(12) United States Patent
Nishino et al.

(10) Patent No.: US 7,933,059 B2
(45) Date of Patent: Apr. 26, 2011

(54) MIRROR DEVICE ACCOMMODATED BY LIQUID-COOLED PACKAGE

(75) Inventors: Hirokazu Nishino, Akishima (JP); Yoshihiro Maeda, Hachioji (JP); Fusao Ishii, Menlo Park, CA (US)

(73) Assignees: Silicon Quest Kabushiki-Kaisha (JP); Olympus Corporation (JP)

( * ) Notice: Subject to any disclaimer, the term of this patent is extended or adjusted under 35 U.S.C. 154(b) by 313 days.

(21) Appl. No.: 12/291,943

(22) Filed: Nov. 13, 2008

(65) Prior Publication Data

US 2009/0128935 A1   May 21, 2009

Related U.S. Application Data

(60) Provisional application No. 61/003,367, filed on Nov. 16, 2007.

(51) Int. Cl.
*G02B 26/00* (2006.01)
(52) U.S. Cl. .......................................... 359/290; 359/291
(58) Field of Classification Search .................. 359/290, 359/291, 223, 224, 238
See application file for complete search history.

(56) References Cited

U.S. PATENT DOCUMENTS

| | | | |
|---|---|---|---|
| 4,772,110 A * | 9/1988 | Roszhart | 359/845 |
| 5,537,303 A | 7/1996 | Stacy | |
| 5,758,956 A | 6/1998 | Bornhorst et al. | |
| 6,011,640 A | 1/2000 | Hutton | |
| 6,304,243 B1 | 10/2001 | Kondo et al. | |
| 6,523,959 B2 | 2/2003 | Lee et al. | |
| 6,736,513 B2 | 5/2004 | Koyama et al. | |
| 6,751,027 B2 | 6/2004 | Van Den Bossche et al. | |
| 6,769,792 B1 | 8/2004 | Bornhorst | |
| 6,803,886 B2 | 10/2004 | Kondo et al. | |
| 6,814,445 B2 | 11/2004 | Kalyandurg et al. | |
| 7,085,034 B2 | 8/2006 | Fujimori et al. | |
| 7,270,418 B2 | 9/2007 | Fujimori et al. | |
| 2006/0048520 A1* | 3/2006 | Huang et al. | 62/3.5 |
| 2008/0030688 A1* | 2/2008 | Lee | 353/54 |
| 2009/0128873 A1* | 5/2009 | Lopes et al. | 359/15 |

* cited by examiner

*Primary Examiner* — Timothy J Thompson
(74) *Attorney, Agent, or Firm* — Bo-In Lin

(57) ABSTRACT

The present invention discloses a mirror device that comprises 1) a mirror element for modulating incident light emitted from a light source and for controlling the reflecting direction of incident light, and 2) a coolant flow channel for containing and flowing a liquid coolant through the flow channel to carry away heat generated in the mirror device.

12 Claims, 14 Drawing Sheets

US 7,933,059 B2

MIRROR DEVICE ACCOMMODATED BY LIQUID-COOLED PACKAGE

CROSS REFERENCE TO RELATED APPLICATIONS

This application is a Non-provisional application claiming a Priority date of Nov. 16, 2007 based on a previously filed Provisional Application 61/003,367 and a Non-provisional patent application Ser. No. 11/121,543 filed on May 3, 2005 issued into U.S. Pat. No. 7,268,932. The application Ser. No. 11/121,543 is a Continuation In Part (CIP) Application of three previously filed Applications. These three applications are Ser. No. 10/698,620 filed on Nov. 1, 2003, Ser. No. 10/699,140 filed on Nov. 1, 2003 now issued into U.S. Pat. No. 6,862,127, and Ser. No. 10/699,143 filed on Nov. 1, 2003 now issued into U.S. Pat. No. 6,903,860 by the Applicant of this patent applications. The disclosures made in these patent applications are hereby incorporated by reference in this patent application.

BACKGROUND OF THE INVENTION

1. Field of the Invention

The present invention relates generally to systems and methods to configure a projection apparatus comprising a mirror device. More particularly, this invention relates to systems and methods to configure an image projection system with a mirror device implemented with a liquid-cooled package.

2. Description of the Related Art

Even though there have been significant advances made in recent years in technologies implementing an electromechanical mirror device as a spatial light modulator (SLM), there are still limitations and difficulties when it is employed to display a high quality image. Specifically, when the images are digitally controlled, the image quality is adversely affected due to the fact that the images are not displayed with a sufficient number of gray scales.

An electromechanical mirror device implemented as the spatial light modulator (SLM) for an image projection apparatus has recently drawn a considerable amount of popular interest. The electromechanical mirror device commonly employs a relative large number of micromirrors configured as a "mirror array". In general, the number of mirror elements ranges from 60,000 to several millions, placed on the surface of a substrate in an electromechanical mirror device.

Referring to FIG. 1A, an image display system 1 including a screen 2 is disclosed in a relevant U.S. Pat. No. 5,214,420. A light source 10 is used to generate light beams to project illumination for the display images on the display screen 2. The light 9 projected from the light source is further concentrated and directed toward lens 12 by way of mirror 11. Lenses 12, 13 and 14 form a beam columnator operative to columnate the light 9 into a column of light 8. A spatial light modulator 15 is controlled by a computer 19 through data transmitted over data cable 18 to selectively redirect a portion of the light from path 7 toward lens 5 to display on screen 2. FIG. 1B shows a SLM 15 that has a surface 16 that includes an array of switchable reflective elements 17, 27, 37, and 47, each of these reflective elements is attached to a hinge 30. When the element 17 is in an ON position, a portion of the light from path 7 is reflected and redirected along path 6 to lens 5 where it is enlarged or spread along path 4 to impinge on the display screen 2 to form an illuminated pixel 3. When the element 17 is in an OFF position, the light is reflected away from the display screen 2 and, hence, pixel 3 is dark.

Each of the mirror elements constituting a mirror device functions as a spatial light modulator (SLM), and each mirror element comprises a mirror and electrodes. A voltage applied to the electrode(s) generates a coulomb force between the mirror and the electrode(s), making it possible to control and incline the mirror. The inclined mirror is "deflected" according to a common term used in this patent application for describing the operational condition of a mirror element.

When a mirror is deflected with a voltage applied to the electrode(s), the deflected mirror also changes the direction of the reflected light in reflecting an incident light. The direction of the reflected light is changed in accordance with the deflection angle of the mirror. The present patent application refers to the light reflected to a projection path designated for image display as "ON light", and refers to a light reflected in a direction other than the designated projection path for image display as "OFF light". When the light reflected by the mirror to the projection path is of lesser intensity than the "ON light", because only a portion of the reflected light is directed in the ON light direction, it is referred to as "intermediate light".

The present patent application defines an angle of rotation along a clockwise (CW) direction as a positive (+) angle and that of a counterclockwise (CCW) direction as a negative (−) angle. A deflection angle is defined as zero degrees (0°) when the mirror is in the initial state.

The on-and-off states of the micromirror control scheme, as that implemented in the U.S. Pat. No. 5,214,420 and in most conventional display systems, impose a limitation on the quality of the display. Specifically, applying the conventional configuration of a control circuit limits the gray scale gradations produced in a conventional system (PWM between ON and OFF states), limited by the LSB (least significant bit, or the least pulse width). Due to the ON-OFF states implemented in the conventional systems, there is no way of providing a shorter pulse width than the duration represented by the LSB. The least quantity of light, which determines the gray scale, is the light reflected during the least pulse width. The limited levels of the gray scale lead to a degradation of the display image.

Specifically, FIG. 1C is a schematic circuit diagram to illustrate a control circuit implemented in a mirror element for controlling a micromirror according to U.S. Pat. No. 5,285,407. The control circuit includes memory cell 32. Various transistors are referred to as "M*" where "*" designates a transistor number and each transistor is an insulated gate field effect transistor. Transistors M5, and M7 are p-channel transistors; transistors, M6, M8, and M9 are n-channel transistors. The capacitances, C1 and C2, represent the capacitive loads in the memory cell 32. The memory cell 32 includes an access switch transistor M9 and a latch 32a based on a Static Random Access Memory (SRAM) switch design. All access transistors M9 on an Row line receive a DATA signal from a different Bit-line 31a. The particular memory cell 32 is accessed for writing a bit to the cell by turning on the appropriate row select transistor M9, using the ROW signal functioning as a Word-line. Latch 32a consists of two cross-coupled inverters, M5/M6 and M7/M8, which permit two stable states that include a state 1 when is Node A high and Node B low, and a state 2 when Node A is low and Node B is high.

The mirror is driven by a voltage applied to the landing electrode and is held at a predetermined deflection angle on the landing electrode. An elastic "landing chip" is formed on a portion on the landing electrode that makes contact with the mirror, and assists in deflecting the mirror towards the opposite direction when the deflection of the mirror is switched.

The landing chip is designed to have the same potential as the landing electrode, so that a shorting is prevented when the landing electrode is in contact with the mirror.

Each mirror formed on a device substrate has a square or rectangular shape, and each side has a length of 4 to 15 um. In this configuration, a portion of the reflected light is reflected not from the mirror surface but from the gaps between the mirrors or other surfaces of the structures of the mirror device. These "unintentional" reflections are not applied to project an image, however, are inadvertently generated and may interfere with the reflected light for image display. The contrast of the displayed image is degraded due to the interference generated from these unintentional reflections generated by the gaps between the mirrors. In order to overcome such problems, the mirrors are arranged on a semiconductor wafer substrate with a layout to minimize the gaps between the mirrors. One mirror device is generally designed to include an appropriate number of mirror elements, wherein each mirror element is manufactured as a deflectable mirror on the substrate for displaying a pixel of an image. The appropriate number of elements for displaying an image is configured in compliance with the display resolution standard according to the VESA Standard defined by Video Electronics Standards Association or by television broadcast standards. When a mirror device is configured with the number of mirror elements in compliance with WXGA (resolution: 1280 by 768) defined by VESA, the pitch between the mirrors of the mirror device is 10 μm, and the diagonal length of the mirror array is about 0.6 inches.

The control circuit, as illustrated in FIG. 1C, controls the mirrors to switch between two states, and the control circuit drives the mirror to oscillate to either an ON or OFF deflected angle (or position) as shown in FIG. 1A.

The minimum intensity of light reflected from each mirror element for image display, i.e., the resolution of gray scale of image display for a digitally controlled image display apparatus, is determined by the least length of time that the mirror may be controlled to stay in the ON position. The length of time a micromirror is in an ON position is controlled by a multiple bit word. FIG. 1D shows the "binary time intervals" when controlling micromirrors with a four-bit word. As shown in FIG. 1D, the time durations have relative values of 1, 2, 4, 8, which in turn define the relative brightness for each of the four bits where "1" is the least significant bit and "8" is the most significant bit. According to the control mechanism as shown, the minimum controllable differences between gray scales for showing different levels of brightness is a represented by the "least significant bit" that maintains the micromirror at an ON position.

For example, assuming n bits of gray scales, one time frame is divided into $2^n-1$ equal time periods. For a 16.7-millisecond frame period and n-bit intensity values, the time period is $16.7/(2^n-1)$ milliseconds.

Having established these times for each pixel of each frame, pixel intensities are quantified such that black is a 0 time period, the intensity level represented by the LSB is 1 time period, and the maximum brightness is $2^n-1$ time periods. Each pixel's quantified intensity determines its ON-time during a time frame. Thus, during a time frame, each pixel with a quantified value of more than 0 is ON for the number of time periods that correspond to its intensity. The viewer's eye integrates the pixel brightness so that the image appears the same as if it were generated with analog levels of light.

For controlling deflectable mirror devices, the PWM applies data to be formatted into "bit-planes", with each bit-plane corresponding to a bit weight of the intensity of light. Thus, if the brightness of each pixel is represented by an n-bit value, each frame of data has the n-bit-planes. Then, each bit-plane has a 0 or 1 value for each mirror element. According to the PWM control scheme described in the preceding paragraphs, each bit-plane is independently loaded and the mirror elements are controlled according to bit-plane values corresponding to the value of each bit during one frame. Specifically, the bit-plane according to the LSB of each pixel is displayed for 1 time period.

When adjacent image pixels are displayed with a very coarse gray scale caused by great differences in the intensity of light, thus, artifacts are shown between these adjacent image pixels. That leads to the degradations of image quality. The image degradations are especially pronounced in the bright areas of image where there are "bigger gaps" between of the gray scales of adjacent image pixels. The artifacts are generated by technical limitations in that the digitally controlled image does not provide a sufficient number of the gray scale.

As the mirrors are controlled to operate in a state of either ON or OFF, the intensity of light of a displayed image is determined by the length of time each mirror is in the ON position. In order to increase the number of gray scales of a display, the switching speed of the ON and OFF positions for the mirror must be increased. Therefore the digital control signals need be increased to a higher number of bits. However, when the switching speed of the mirror deflection is increased, a stronger hinge for supporting the mirror is necessary to sustain the required number of switches between the ON and OFF positions for the mirror deflection. In order to drive the mirrors with a strengthened hinge, a higher voltage is required. The higher voltage may exceed twenty volts and may even be as high as thirty volts. The mirrors produced by applying the CMOS technologies are probably not appropriate for operating the mirror at such a high range of voltages, and therefore DMOS mirror devices may be required. In order to achieve a higher degree of gray scale control, more complicated production processes and larger device areas are required to produce the DMOS mirror. Conventional mirror controls are therefore faced with a technical problem in that accuracy of gray scales and range of the operable voltage have to be sacrificed for the benefits of a smaller image display apparatus.

There are many patents related to light intensity control. These patents include U.S. Pat. Nos. 5,589,852, 6,232,963, 6,592,227, 6,648,476, and 6,819,064. There are further patents and patent applications related to different light sources. These patents include U.S. Pat. Nos. 5,442,414, 6,036,318 and Application 20030147052. Also, U.S. Pat. No. 6,746,123 has disclosed particular polarized light sources for preventing the loss of light. However, these patents or patent applications do not provide an effective solution to attain a sufficient number of the gray scale in the digitally controlled image display system.

Furthermore, there are many patents related to a spatial light modulation including U.S. Pat. Nos. 2,025,143, 2,682, 010, 2,681,423, 4,087,810, 4,292,732, 4,405,209, 4,454,541, 4,592,628, 4,767,192, 4,842,396, 4,907,862, 5,214,420, 5,287,096, 5,506,597, and 5,489,952. However, these inventions do not provide a direct solution for a person skilled in the art to overcome the above-discussed limitations and difficulties.

In view of the above problems, US Patent Application 20050190429 has disclosed a method for controlling the deflection angle of the mirror to express higher gray scales of an image. In this disclosure, the intensity of light obtained during the oscillation period of the mirror is about 25% to 37% of the intensity of light obtained while the mirror is held in the ON position continuously.

According to this control process, it is not necessary to drive the mirror at a high speed. Also, it is possible to provide a higher number of the gray scale using a hinge with a low elastic constant. Hence, such a control makes it possible to reduce the voltage applied to the landing electrode.

An image display apparatus using the mirror device described above is broadly categorized into two types: a single-plate image display apparatus implemented with only one spatial light modulator and a multi-plate image display apparatus implemented with a plurality of spatial light modulators. In the single-plate image display apparatus, a color image is displayed by changing, in turn, the color (i.e. frequency or wavelength) of projected light over time. In a multi-plate the image display apparatus, a color image is displayed controlling the multiple spatial light modulators, corresponding to beams of light having different colors (i.e. frequencies or wavelengths), to modulate and combine the beams of light continuously.

For projection apparatuses there has been an increasing demand for high-resolution definitions, such as a full high definition (Full-HD; 1920×1080 pixels) television these days, prompting the development of higher resolution display techniques.

A mirror device is a spatial light modulators used for such a projection apparatus. The mirror device is comprised of a mirror array of one to eight million mirror-elements in two dimensions on a device substrate.

In order to meet the demand for ever-higher resolutions in projection apparatuses, the number of mirror elements must be increased. The increase in the number of mirror elements increases the size of the mirror device, which, in turn, increases the size of the projection apparatus, which is an undesirable result. Therefore, there is a need to decrease the size of the mirror device in order to project a higher resolution image while maintaining the current size of the projection apparatus. There is also a need to decrease the size of the mirror of each mirror element in order to decrease the size of the mirror device.

Additionally, there is a package for protecting the mirror device. One aspect of the package to store cover the mirror device by forming an intermediate member extended from the device substrate of the mirror device to support and attach to a cover glass.

Such a configuration, however, requires the device substrate be enlarged in order to accommodate the intermediate member. This in turn decreases the number of device substrates that can be cut from one semiconductor wafer, which increases the cost (and, eventually, the price) of the device substrate.

Furthermore, decreasing the number of device substrates that can be cut from one semiconductor wafer increases the ratio of one failed device substrate to the total number of failed device substrates proportionate to the number of device substrates cut from one wafer.

Additionally, the current configuration of such a package is a mirror device that is placed on a ceramic substrate separate from the device substrate and covered with a metallic cover.

This metallic cover excels in dissipating heat to prevent the inside of the package from temperature rise due to heat caused by the light irradiated on the mirror device and the heat generated by its operation.

However, it is not easy to produce a metallic cover in the desired form. Furthermore, increasing the surface area of the metallic cover increases the impact of thermal expansion, which tends to deform the metallic cover.

Such a mirror device is heated by 1) the external heat from the light source and 2) the internal heat generated by the operation of the mirror device.

The heating of the mirror device causes thermal expansion. This in turn changes the positions of the individual mirrors placed on the substrate surface, and creates a crack in the substrate and a separation of constituent components, thus hampering the function of the mirror device. Therefore, an improvement in the heat dissipation efficiency of the mirror device is needed.

Furthermore, the design of the package is faced with many problems in association with the decrease in size of the mirror device.

For example, a mirror array comprising about two million pixels used for Full HD is currently about 24.1 mm (0.95 inches) diagonally. In order to make a mirror anywhere between 10.2 mm and 22.1 mm (i.e., between 0.4 and 0.87 inches) in size, the mirror must be decreased in size and the package must be designed with consideration of the following: the heat dissipation of heat generated by the mirror device, the reduction of floating capacitance, the shielding of light to avoiding extraneous incident light, and a change in the form of package due to heat.

The following lists conventional techniques related to the package of a mirror device.

Reference patent document 1 provides components of the diffraction grating and light modulation device with a package of potting resin.

Reference patent document 2 provides a substrate on which mirrors are formed with a package with a cover glass.

Reference patent document 3 provides a substrate on which mirrors are formed with a package with a cover glass.

Reference patent document 4 provides a substrate on which mirrors are formed with a package with a cover glass.

Reference patent document 5 provides a substrate on which mirrors are formed that is joined to a cover glass with an epoxy adhesive.

Reference patent document 6 provides a cover glass welded with a metallic sealing ring.

Reference patent document 7 provides a substrate on which mirrors are formed with package with a cover glass, and the aforementioned product is further packaged with another substrate and a cover glass. The patent also provides substrates that are separately sandwiched on the bottom surface of a silicon substrate.

Reference patent document 8 provides a light shield mask that is placed inside of a package substrate having a cavity.

Reference patent document 9 provides a shortened distance between a mirror element and a transparent substrate.

Reference patent document 10 provides a shortened distance between a mirror element and a transparent substrate.

Reference patent document 11 provides a position of the cover glass not covering the light-blocking layer that is shifted from the position of the mirror array.

Reference patent document 12 provides a position of the cover glass not covering the light-blocking layer that is shifted from the position of a mirror array.

Reference patent document 13 provides a light absorption layer on the inside wall of the package.

Reference patent document 14 provides a substrate comprising a transparent electrode electrically connected to another electrode.

Reference patent document 15 provides a getter provided inside of a package.

Reference patent document 16 provides a desiccant between two substrates.

Reference patent document 17 provides an inactivating material enclosed inside of the package.

Reference patent document 18 provides an inactivating material is enclosed inside of the package.

Reference patent document 19 provides a wiring and a package that comprises a line.

Reference patent document 20 provides that the position of the device substrate on a package substrate is determined using the outer form of the device substrate.

Reference patent document 21 provides an optical device placed inside of one package.

Reference patent document 22 provides multiple optical devices placed on a single substrate.

Reference patent document 23 provides a liquid or solid optical material layered between two substrates.

Reference patent document 24 provides a structural column used for joining a MEMS substrate and another substrate together with soldering.

Reference patent document 25 provides a sealing member possessing a melting point that is no lower than 160 degrees C.

Reference patent document 26 provides a heater inside of a substrate.

Reference patent document 27 provides a heater inside of a substrate.

Reference patent document 28 provides multiple support columns accommodated between multiple of substrates.

Reference patent document 29 provides a mirror comprising a deflection axis not parallel to the side of the outer form of the mirror array.

[Patent document 1] Laid-Open Japanese Patent Application Publication No. 2006-301153

[Patent Document 2] U.S. Pat. No. 7,023,607
[Patent Document 3] U.S. Pat. No. 7,027,207
[Patent Document 4] U.S. Pat. No. 6,947,200
[Patent Document 5] U.S. Pat. No. 6,975,444
[Patent Document 6] U.S. Pat. No. 6,827,449
[Patent Document 7] U.S. Pat. No. 7,164,199
[Patent Document 8] U.S. Pat. No. 6,762,868
[Patent Document 9] U.S. Pat. No. 6,952,301
[Patent Document 10] U.S. Pat. No. 6,906,847
[Patent Document 11] U.S. Pat. No. 7,046,419
[Patent Document 12] U.S. Pat. No. 7,034,985
[Patent Document 13] U.S. Pat. No. 7,042,639
[Patent Document 14] U.S. Pat. No. 7,110,160
[Patent Document 15] U.S. Pat. No. 6,664,779
[Patent Document 16] U.S. Pat. No. 6,995,893
[Patent Document 17] U.S. Pat. No. 5,936,758
[Patent Document 18] U.S. Pat. No. 5,939,785
[Patent Document 19] U.S. Pat. No. 5,610,625
[Patent Document 20] U.S. Pat. No. 6,649,435
[Patent Document 21] U.S. Pat. No. 6,955,941
[Patent Document 22] U.S. Pat. No. 6,947,020
[Patent Document 23] U.S. Pat. No. 7,002,727
[Patent Document 24] U.S. Pat. No. 6,940,636
[Patent Document 25] United States Patent Application 20040238600
[Patent Document 26] United States Patent Application 20040232535
[Patent Document 27] United States Patent Application 20050157374
[Patent Document 28] United States Patent Application 20050275930
[Patent Document 29] United States Patent Application 20050191789

SUMMARY OF THE INVENTION

In consideration of the above-described problems, the present invention provides a mirror device with a liquid-cooled package.

The first aspect of the present invention provides a mirror device which comprises 1) a mirror element for modulating incident light emitted from a light source and controlling the reflecting direction of the incident light, and 2) a coolant flow path to be filled with a liquid coolant.

The second aspect of the present invention provides the mirror device according to the first aspect, further comprising: a device substrate arraying the mirror elements; a package substrate for retaining the device substrate; a cover glass joined to the package substrate; a cooling/heat dissipation element in contact with at least either the package substrate or the device substrate; and a coolant flow path to be filled with the liquid coolant for cooling the cooling/heat-dissipation heat dissipation element.

A third aspect of the present invention provides the mirror device according to the first aspect, wherein the package substrate comprises an opening smaller than the device substrate, wherein the device substrate closes one end of the opening and is cooled with the liquid coolant where it is exposed through the opening.

A fourth aspect of the present invention provides the mirror device according to the first aspect, further comprising: a device substrate arraying the mirror elements; a package substrate for retaining the device substrate; a cover glass joined to the package substrate; and a cooling/heat dissipation element in contact with at least either the package substrate or device substrate and in which the coolant flow path is situated.

A fifth aspect of the present invention provides the mirror device according to the first aspect, further comprising: a device substrate arraying the mirror elements; a package substrate which retains the device substrate and in which the coolant flow path is situated; and a cover glass joined to the package substrate.

A sixth aspect of the present invention provides the mirror device according to the first aspect, further comprising a coolant circulation unit for circulating the liquid coolant.

A seventh aspect of the present invention provides the mirror device according to the first aspect, further comprising a radiator for cooling the liquid coolant.

An eighth aspect of the present invention provides the mirror device according to the seventh aspect, further comprising a cooling fan for cooling the radiator.

A ninth aspect of the present invention provides the mirror device according to the first aspect, wherein the coolant flow path is filled with a water solution possessing either antirust properties or anti-corrosion properties.

A tenth aspect of the present invention provides the mirror device according to the first aspect wherein the coolant flow path is filled with the liquid coolant for cooling at least either the power supply for the mirror device or the system controller for controlling the mirror device.

An eleventh aspect of the present invention provides the mirror device according to the first aspect, further including the liquid coolant.

A twelfth aspect of the present invention provides a mirror device which arrays, on a device substrate, mirror elements for modulating incident light emitted from a light source and controlling the reflecting direction of the incident light, comprising: a package substrate which retains the device substrate and in which a coolant flow path to be filled with a liquid coolant containing an electrolyte is situated; a cover glass joined to the package substrate; and electrodes which are placed on the package substrate and on which different charges are retained.

A thirteenth aspect of the present invention provides the mirror device according to the twelfth aspect, further including the liquid coolant and a package substrate with an opening smaller than the device substrate; the device substrate is placed so as to close one end of the opening so that the liquid coolant flowing through the opening part contacts the bottom surface of the device substrate.

A fourteenth aspect of the present invention provides a mirror device which comprises, on a device substrate, mirror elements for modulating incident light emitted from a light source and controlling the reflecting direction of the incident light, comprising: a package substrate for retaining the device substrate; a cover glass joined to the package substrate; an electro-osmotic element which is joined to the package substrate and which comprises a coolant flow path to be filled with a liquid coolant containing an electrolyte; and electrodes which are placed on both sides of the electro-osmotic element and on which different charges are retained.

A fifteenth aspect of the present invention provides the mirror device according to the fourteenth aspect, further including the liquid coolant.

The above-described aspects make it possible to provide a mirror device with a liquid-cooled package. It also makes it possible to provide a liquid-cooled package compatible with mirror device decreased in size.

The present invention improves the heat dissipation efficiency of a mirror device. The present invention also provides cooling for constituent units, e.g., the mirror device, the power supply and the CPU of the system controller of the projection apparatus, thereby making it possible to prevent a failure of the projection apparatus caused by heat generation.

BRIEF DESCRIPTION OF THE DRAWINGS

The present invention is described in detail below with reference to the following Figures.

DESCRIPTION OF THE PREFERRED EMBODIMENTS

Figure 1A:
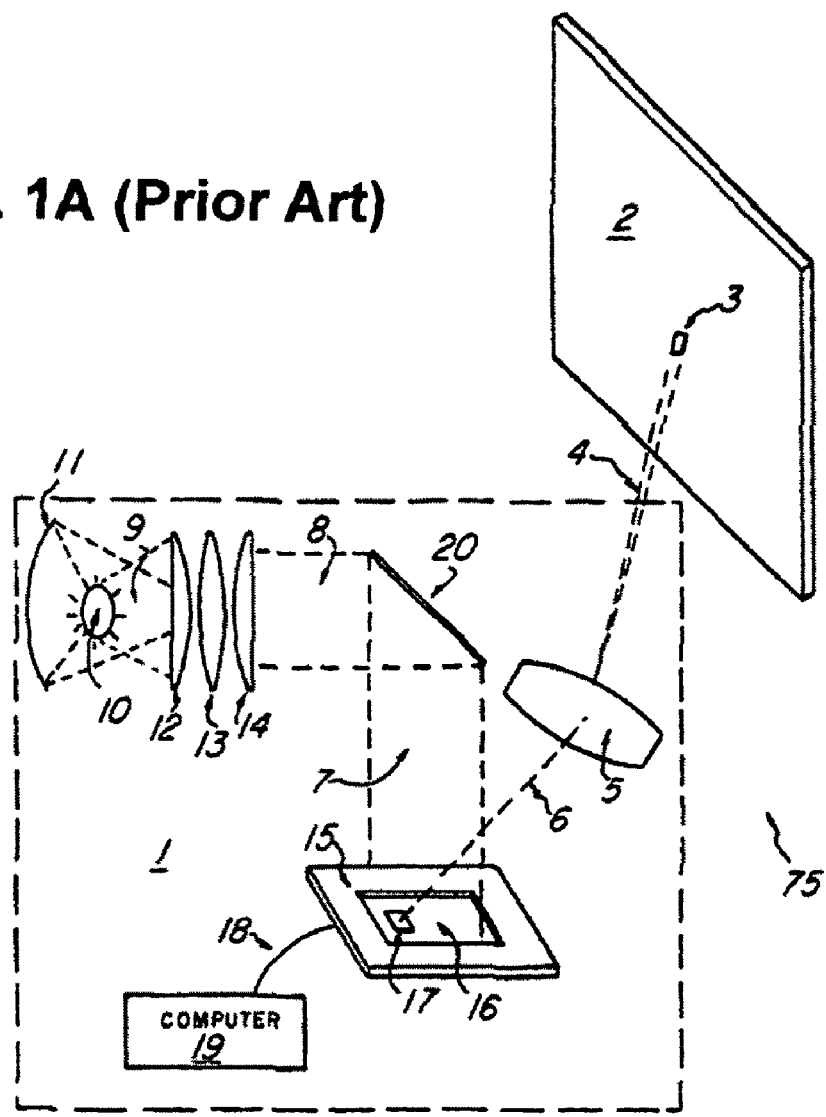
FIG. 1A is a functional block diagram showing the configuration of a projection apparatus according to a conventional technique.
Figure 1B:
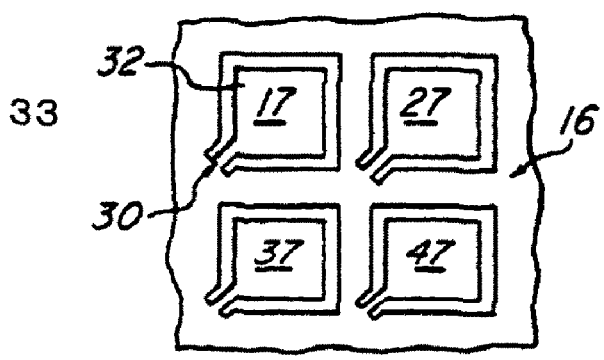
FIG. 1B is a top view diagram showing the configuration of a mirror element of a projection apparatus according to a conventional technique.
Figure 1C:
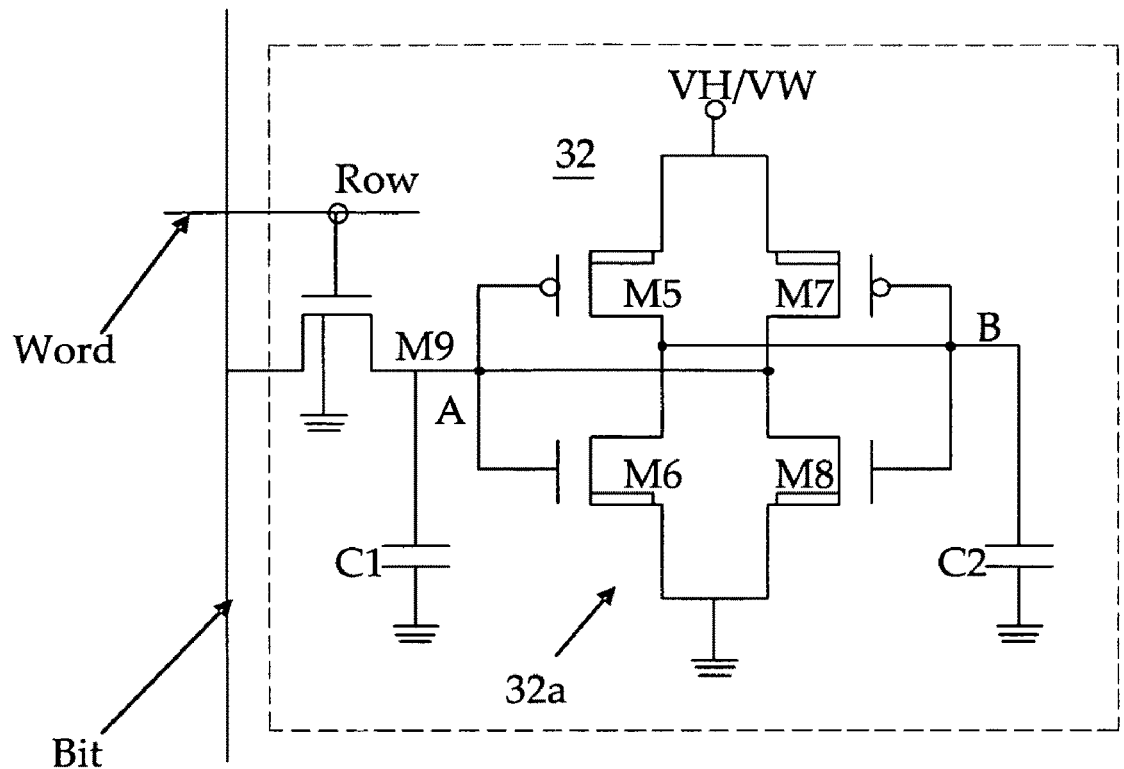
FIG. 1C is a circuit diagram showing the circuit configuration of the drive circuit of a mirror element of a projection apparatus according to a conventional technique.
Figure 1D:
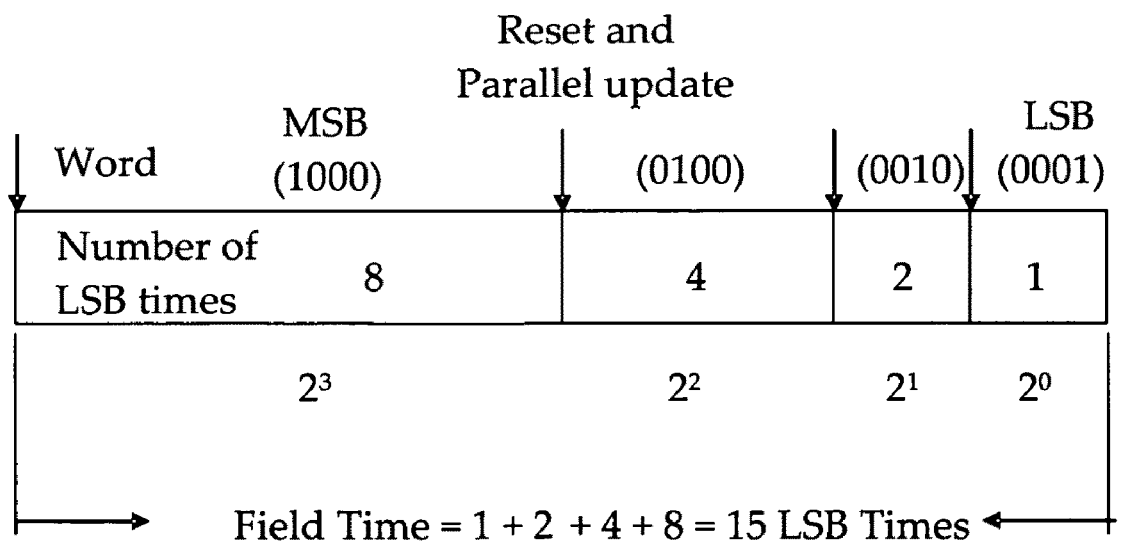
FIG. 1D is a timing diagram showing the mirror control time schemes according to the image data format used in a projection apparatus according to a conventional technique.

The decreasing size of a mirror element makes it possible to further decrease the size of a mirror device. For example, a smaller mirror device is manufactured by forming a large number of approximately square mirror elements. The diagonal size of a mirror array can be smaller than a conventional configuration by arranging multiple smaller mirror elements on a device substrate. Then the device substrate can also be decreased in size, thereby reducing the volume of the device substrate. Therefore, an increase in the volume of this device substrate due to thermal expansion is smaller than that of the device substrate with a mirror array that is not decreased in size.

At the same time, the projection of extraneous light in the mirror device can be avoided by deflecting a mirror at a large angle. For example, a large deflection angle, such as −13 to +13 degrees, enables a large angle changeover of the direction of modulation lights between a state in which the reflection light is incident to a projection lens (i.e., an ON state) and a state in which the reflection light is not incident to a projection lens (i.e., an OFF state). The projection of extraneous light reflected by the mirror device can thereby be avoided. As a result, the contrast of the projection image can be enhanced. Note that the present specification document defines the reference of the deflection angle of mirror as minus (−) for an angle in clockwise (CW) and plus (+) for an angle in counterclockwise (CCW), with the deflection angle defined as "0" degrees when the mirror is in the initial state.

Furthermore, the numerical aperture NA of the illumination light flux can be minimized when a light such as a light flux emitted from a laser light source projected with a small divergent angle for transmitting as approximately parallel flux for reflection from a mirror device. With a smaller numerical aperture NA of the illumination light, an optical layout for avoiding interference between a projection light path and an illumination light path can be configured with a smaller deflection angle of mirror. Specifically, the deflection angle of mirror can be set in an exemplary embodiment at ±10 degrees.

In the meantime, in generating an image with a gray scale by controlling the modulation of a mirror device is achieved by controlling the number of free oscillations of the mirror between the deflection angles in the ON state and OFF state. It is therefore achievable to control the quantity of light reflected to the projection light path, as the applicant of the present invention has disclosed in application Ser. No. 11/121,541.

For example, let it be assumed that the deflection angle of mirror is +13 degrees in the ON state and the deflection angle of mirror is −13 degrees in the OFF state. The mirror performing a free oscillation between the deflection angle of the ON state and that of the OFF state changes the ON state and OFF state frequently. Controlling the number of changeovers makes it possible to make the quantity of light smaller than that when the mirror is retained in the complete ON state incident to the projection lens. The quantity of light of the projection light can thereby be adjusted and an image of a higher grade of gray scale can be projected. Note that the deflection angle of the free oscillation state can also beset at an angle that is smaller than a physically possible oscillation angle, such as ±8 degrees, ±4 degrees, et cetera, within the deflection angles (±13 degrees) of the ON state and OFF state.

In the operation control of the above-described mirror, the timing of the free oscillation of the mirror and that of the light emission should be synchronized. Specifically, the illumination light can be turned ON while the mirror is deflected at angles so as to reflect at least a portion of the illumination light incident to the incidence pupil of the projection lens, while the illumination light is turned OFF while the mirror is deflected at other angles. Such a configuration makes it possible to reduce the irradiation of extraneous light onto the mirror device. As a result, the generation of heat caused by the absorption of light by the mirror can be reduced.

Furthermore, a high-grade gray scale image can be flexibly adjusted with adjustable quantity of light projected from the light source. Note that it is preferable that the light source be capable of performing pulse emission. Pulse emission makes it possible to increase the pulse interval when the mirror is in the OFF state and space out the pulse (s) when the mirror is in the ON state, thereby making it possible to adjust the quantity of light in accordance with the image signal (i.e., in accordance with the brightness and color of the entire screen).

Furthermore, a preferable configuration controls such a light source with a variable circuit that emits a quantity of light that is intermediate between the maximum emission and OFF states. Furthermore, such a light source may be comprised of multiple sub-light sources. With such a configuration, the quantity of light can also be adjusted by the number of sub-light sources. Alternative configurations may comprise a light source including several sub-light sources that emit light of wavelengths within the range of several nanometers of the desired single wavelength.

When the light is irradiated onto a mirror device with the above-described light source, the light is absorbed by the mirror surface. The light passes through the gap between mirrors to enter and be absorbed by the device substrate. These phenomena cause the mirror device to accumulate heat. The accumulated heat in the mirror device causes high temperatures inside of the package further causes the thermal expansion in the individual components of the mirror device. This in turns causes the mirror position to shift, which possibly hampers the function of the mirror device.

Accordingly, the following descriptions disclose exemplary embodiments of a liquid-cooled package which 1) protects the mirror device from foreign materials (e.g. dust) and damage that may cause operational failure and 2) provides heat dissipation cools the mirror device for good heat dissipation efficiency.

Embodiment 1

The following is a description of the configuration of a liquid-cooled package of a mirror device according to preferred embodiment 1.

Figure 2A:
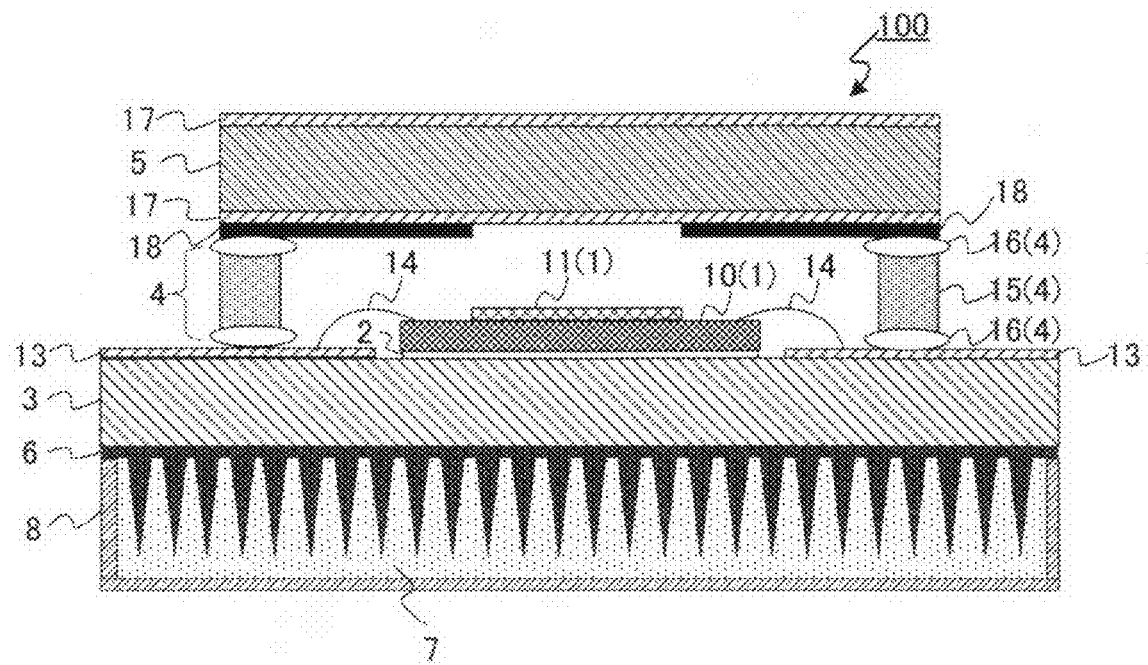
FIG. 2A is a front cross-sectional diagram of an assembled body comprising a mirror device with a liquid-cooled package.
Figure 2B:
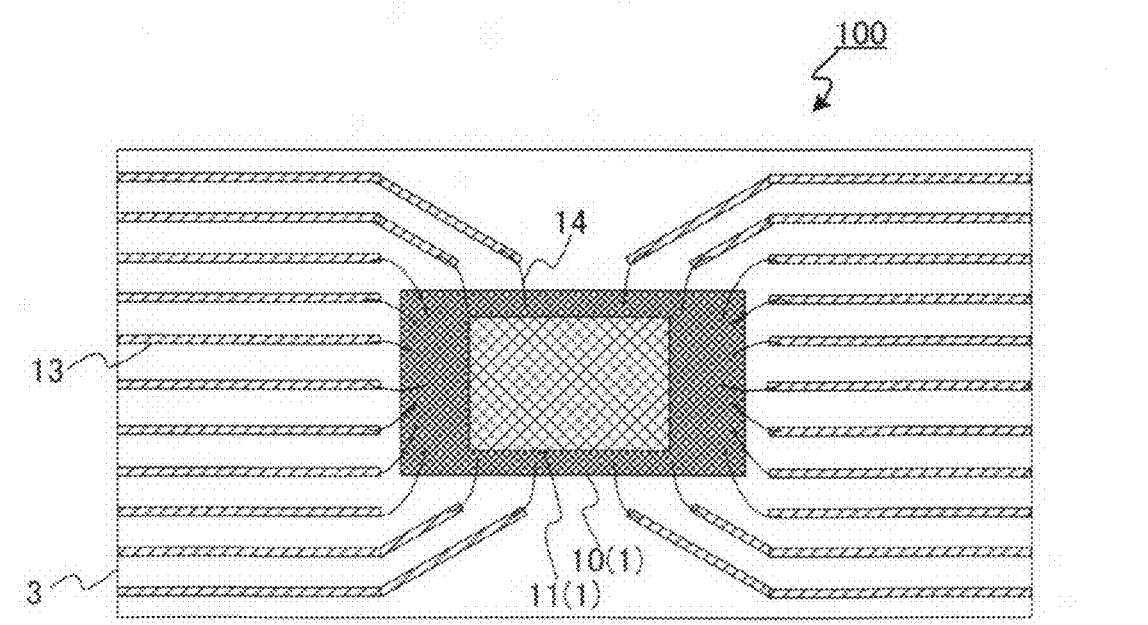
FIG. 2B is a plain view diagram of the assembled body shown in FIG. 2A, with the cover glass and intermediate element removed.
Figure 2C:
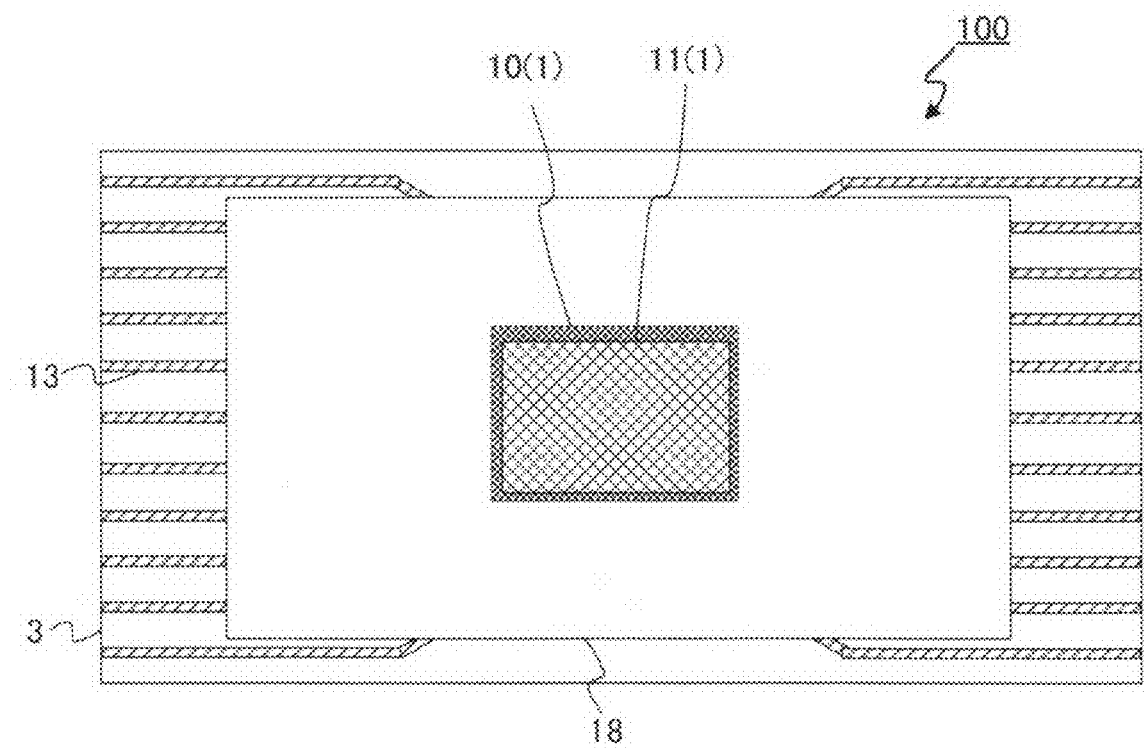
FIG. 2C is a plain view diagram of the assembled body shown in FIG. 2A.

FIGS. 2A through 2C illustrate a package assembly 100 for containing and protecting a mirror device 1 and functioning as a liquid-cooled package.

The package assembly 100 comprises mirror device 1, thermal conduction element 2, package substrate 3, intermediate element 4, cover glass 5, cooling/heat dissipation element 6 (e.g., a heat sink), coolant 7, and coolant cover 8. Here, the liquid-cooled package is a structure excluding mirror device 1. The liquid-cooled package shown in FIG. 2A comprising thermal conduction element 2, package substrate 3, intermediate element 4, cover glass 5, cooling/heat-dissipation heat dissipation element 6, coolant 7, and coolant cover 8.

Note that mirror device 1 is a mirror device in a narrow sense, whereas the assembled body 100, in which the mirror device in a narrow sense is contained, can be construed as a mirror device in a broad sense.

The following is a description of the individual components of the assembled body 100 shown in FIG. 2A.

Note that the present specification document defines "inside of the package" as the space closely sealing the mirror device 1. In FIG. 2A, for example, "inside of the package" represents the space enclosed by the package substrate 3, intermediate element 4, and cover glass 5.

[Mirror Device]

The mirror device 1 is mainly comprised of mirror array 11, which comprises multiple mirror elements arrayed on a device substrate 10. Furthermore, the mirror device 1 is placed on thermal conduction element 2, which is joined to package substrate 3 or placed directly on package substrate 3.

In the configuration shown in FIG. 2A, the bottom surface of device substrate 10 of mirror device 1 is joined to thermal conduction element 2. Furthermore, thermal conduction element 2 joined to mirror device 1 is placed on package substrate 3. An electrode pad placed on the top surface of device substrate 10 is connected to an electrode pad equipped for circuit wiring pattern 13 on the top surface of package substrate 3 with wire 14.

The material of wire 14 is preferably of high thermal conductivity, such as gold, so as to be able to radiate heat in device substrate 10 by way of wire 14.

Meanwhile, mirror array 11 comprised by an arrangement of multiple mirror elements on device substrate 10 reflects the light emitted from the light source and transmitted through cover glass 5 and controls the direction of the reflection light. Note that the mirror element comprises structures such as an elastic hinge and post so that the structures placed on device substrate 10 support a mirror The heat of the light absorbed in the individual mirrors of mirror array 11 is conducted to device substrate 10 by way of structures such as elastic hinges and posts that comprise the mirror elements. The heat is then conducted from device substrate 10 to thermal conduction element 2 and is radiated outside of the package from package substrate 3 and the like. Note that the elastic hinge, post, and the like preferably use materials with high thermal conductivity.

In order to prevent deformation due to heat, the elastic hinge should be made of a material containing any of following materials: aluminum (Al), tungsten (W), and silicon (Si), all of which have good thermal conductivity. Silicon is especially preferred since it has good mechanical properties and a thermal conductivity of around 168 watts (W)/mK. While there are several crystallization states of silicon, such as amorphous silicon, poly silicon, and single crystal silicon, the material should be selected with consideration of other properties such as elasticity.

Furthermore, in consideration of thermal conduction, other element of mirror device 1 connected to the elastic hinge should be made of materials possessing a thermal conductivity of no less than 150 W/mK.

Therefore, the selection of such materials for the elastic hinge or other element connected to the elastic hinge makes it possible to cause the heat of the light absorbed in the mirror and the heat generated by the operation of the mirror element to be effectively conducted to device substrate 10. As such, the heat can effectively be conducted to device substrate 10 and be radiated outside of the package by way of thermal conduction element 2.

[Thermal Conduction Element]

Thermal conduction element 2 is joined to device substrate 10 and package substrate 3. Thermal conduction element 2 receives, by way of device substrate 10, the heat of the mirror device 1, which is generated by irradiated light, and conducts it to circuit wiring pattern 13 and package substrate 3. As such, thermal conduction element 2 conducts the heat received from device substrate 10 and disperses it outside of the package.

In FIG. 2A, the light absorbed in the mirror and the light coming through the gap between the mirrors and absorbed in the device substrate are turned into heat. The heat is then conducted to package substrate 3 through thermal conduction element 2, which is joined to the bottom surface of device substrate 10.

Thermal conduction element 2 element should be made of a material possessing a thermal conductivity of no lower than 150 W/mK (e.g., W, Si, Al, gold (Au), Silver (Ag) and magnesium (Mg)).

Furthermore, the material of thermal conduction element 2 should be select with consideration of a coefficient of linear expansion. Moreover, since thermal conduction element 2 is joined to device substrate 10, which stores a great deal of heat, thermal expansion should also be taken into consideration.

Furthermore, with the same material as a seal element 16 (which is described later) used for the thermal conduction element 2, the package substrate 3 may be directly joined to the thermal conduction element 2.

[Package Substrate]

Package substrate 3 is joined to three components: cooling/heat dissipation element 6 used for radiating the heat conducted from the package substrate 3, thermal conduction element 2 to which the heat from the device substrate 10 is conducted, and intermediate element 4 used for making a sealed space by being joined to cover glass 5.

Package substrate 3 may use any substrate, e.g. a glass substrate, silicon substrate, ceramic substrate, or metallic substrate.

Package substrate 3 is equipped with circuit wiring pattern 13 (refer to FIG. 2B) for securing an electric conduction with device substrate 10 of mirror device 1. Furthermore, package substrate 3 is provided with a large number of circuit wiring patterns 13, and thereby the pitch between individual wirings is very small. Consequently, a ground wire should be added between individual wirings in order to prevent noise. Additionally, a uniform coating with an insulation layer containing silicon (Si) should be applied on the top surface of package substrate 3 and the wiring of circuit wiring pattern 13 should be placed on the coating.

Furthermore, cooling/heat-dissipation element 6 comprising a heat dissipation plate or metallic heat dissipation element that effectively radiate the heat conducted from package substrate 3 can be joined to the bottom surface of package substrate 3.

Note that the larger the surface areas of package substrate 3 and cooling/heat dissipation element 6, the better the heat dissipation efficiency becomes. Package substrate 3 may also be made of the same material as that of device substrate 10.

[Circuit Wiring Pattern]

Circuit wiring pattern 13 is the wiring of a control circuit for controlling mirror device 1, and is electrically connected to device substrate 10.

The metallic material constituting circuit wiring pattern 13 is preferably W, Al, Au, Ag, Cu, Si, or Mg, all of which possesses thermal conductivity of no less than a heat dissipation rate of 150 W/mk. Note that these metallic materials can also be used for the thermal conduction element 2.

A great amount of data is required to drive mirror device 1 comprising, for example, one to four million pixels mirror elements or more and with a high grade such as 10-bit gray scale. Therefore, high-speed data transfer is required. The floating capacitance determined by the resistance value and capacitance of circuit wiring pattern 13 largely influences the data transfer speed. Because of this, circuit-wiring pattern 13 should be made of either aluminum (Al) with the resistance value of 2.5 to $3.55*10^{-8}$ ohmmeter, tungsten (W) with that of 4.9 to $7.3*10^{-8}$ ohmmeter, gold (Au) with that of 2.05 to $2.88*10^{-8}$ ohmmeter, or copper (Cu) with that of 1.55 to $2.23*10^{-8}$ ohmmeter. All of these maintain the temperature range of 0 to 100 degrees C.

[Intermediate Element]

Intermediate element 4 is placed on the top surface of package substrate 3, and supports cover glass 5, which provides a sealed space between package substrate 3 and cover glass 5.

Intermediate element 4 comprises an intermediate element 15, which determines the distance between cover glass 5 and package substrate 3 and seal element 16, which is composed of fritted glass (i.e., powdered glass) and a low-temperature melting metal such as solder. Cover glass 5 is welded to package substrate 3 with a low melting metal such as the fritted glass (i.e., powdered glass) or a solder. The fritted glass of seal element 16 is coated between cover glass 5 and intermediate element 15 or between package substrate 3 and intermediate element 15. They are then placed in a furnace, such as electric furnace, and are sandwiched between hot heaters on top and bottom. The temperature of the heaters is then raised to weld seal element 16. Seal element 16 should use a low melting point glass possessing a glass transition temperature not exceeding 400 degrees C. or a metallic material having a melting point no higher than 400 degrees C. The is because circuit wiring pattern 13, which is made of aluminum, is formed on device substrate 10 and package substrate 3, and these components cannot withstand a temperature exceeding 400 degrees C. for an extended period of time. Note that the mirror of the mirror element is also made of an aluminum layer and also the elastic hinge. The application of heat exceeding 400 degrees C. causes a change in the internal stress of the elastic hinge. As a result, the positions of the mirror are changed. The gap between mirrors of mirror array 11 is very narrow, that is, anywhere between 0.1 um and 0.5 µm, and therefore such a change may hamper the function of mirror device 1.

Since the melting point and the coefficient of thermal expansion of fritted glass varies depending on the material, the preferred material is a barium oxide (BaO)- or a lead oxide (PbO)-series leaded glass with a low melting point and good fluidity and sealing properties. Additionally, unleaded glass with transition temperatures between 300 and 400 degrees C. has been developed in recent years and are also preferable for use. For example, a material obtained by adding $TeO_2$, $P_2O_5$, et cetera, to a $V_2O_5$—ZnO—BaO component series material is now available. The coefficient of linear expansion of this material is about 6 to $7*10^{-6}$/K, with good fluidity and sealing properties.

There are several materials with a melting point between 200 and 400 degrees C. For example, an alloy such as Au80Sn20 possesses a melting point anywhere between 260 and 320 degrees C. Furthermore, an alloy such as Sn80Ag20 that is a high-grade tin series solder possesses a melting point between 220 and 270 degrees C., while Sn95Cu5 possesses a melting point between 230 and 370 degrees C. In addition, indium (In) possesses a melting point at about 157 degrees C. The usage of the seal element 16 made of any of these materials makes it easy to weld the individual components.

Note that the intermediate element 15 may be made of the same material as that of the seal element 16.

Intermediate element 4 is should also be made of a material possessing a coefficient of linear expansion equal to or between that of package substrate 3 and device substrate 10.

Package substrate 3 may be made a cavity structure by integrating it with intermediate element 4. This reduces the number of constituent components taken into consideration of the coefficient of linear expansion. A concavity is created where device substrate 10 is placed by applying etching to package substrate 3. Device substrate 10 is placed in this concavity so as to make the surrounding convex part intermediate element 4. This configuration of package substrate 3, which has the same coefficient of linear expansion as that of device substrate 10, forms a cavity structure. Such a cavity structure may also be formed by further depositing material onto package substrate 3.

There is the possibility that dust may accumulate during the production process of mirror device 1 and/or the production process of a projection apparatus comprising mirror device 1. If the dust settles on the top or bottom surface of cover glass 5, the quality of the projected image is degraded. Therefore, when a sealed space is placed between package substrate 3 and cover glass 5, the length of intermediate element 4 should be adjusted so that the distance between the top surface of the mirror of mirror device 1 and the bottom surface of cover glass 5 is no less than a few times the depth of focus of the projection optical system. For example, the distance between the top surface of the mirror of mirror device 1 and the bottom surface of cover glass 5 should be no less than 0.5 mm.

[Cover Glass]

Cover glass 5 is designed to be smaller than package substrate 3, so as to cover the top of mirror device 1, and is joined to package substrate 3 using intermediate element 4. Cover glass 5 1) protects mirror device 1 from external dust and debris, 2) prevents extraneous light from entering mirror device 1 and generating heat inside of package, and 3) prevents the light reflected by mirror array 11 from reflecting diffusely inside the package.

In the configuration shown in FIG. 2A, an anti-reflection (AR) coating 17 is applied to the top and bottom surfaces of cover glass 5 to prevent the light reflected on the top surface of the cover glass from reflecting in the direction of the projection optical system. The AR coating 17 is also applied to the bottom surface of the cover glass to prevent the light reflected by mirror array 11 from being reflected by the bottom surface of cover glass 5, thereby preventing a diffuse reflection of light inside the package.

Furthermore, the top or bottom surface or both of cover glass 5 is equipped with a light shield layer 18 in order to prevent extraneous light from irradiating mirror device 1. In FIG. 2A, the light shield layer 18 is provided on the bottom surface of AR coating 17 applied to the bottom surface of cover glass 5.

Furthermore, as described above, the top surface of the mirror of mirror device 1 and the bottom surface of cover glass 5 should be separated from each other by a certain distance. Such a configuration makes it possible to allow a certain degree of surface roughness of cover glass 5. For example, a surface roughness of cover glass 5 between 0.1 µm to 0.3 µm/20 mm is allowable. The surface of cover glass 5 may also be polished to 0.05 µm to 0.15 µm/20 mm.

[AR Coating]

Anti-reflection (AR) coating 17 is applied to the top or bottom surface or both of cover glass 5 to prevent a reflection on the surface of cover glass 5 and to prevent the light reflected by mirror array 11 from being reflected diffusely inside the package.

The AR coating can be applied by coating, for example, magnesium fluoride (Mg2F) on the surface of the glass or by forming a nano-structure by processing the glass.

When applying a coating on the surface of the glass, a multi-coating is applied so as to correspond to a wide spectrum of wavelengths. Note that a single layer coating may be applicable when the light of only a single wavelength such as a laser light will be used.

When processing for a nano-structure, fine particles are laminated with a gelatinous material and metallic particles are removed by heating or another process and thereby a fine structure can be formed. Note that nano-structure processing makes it possible to correspond to a wide spectrum of wavelengths more easily than by applying a multi-coating that deposits an inorganic material.

The application of AR coating 17 enhances the contrast on an image because the quantity of reflected light of cover glass 5 incident to the projection lens is reduced. Also, more light is incident to mirror array 11. Therefore, AR coating 17 should be formed for the maximum reduction of the reflected light of the wavelength of the incident light.

[Light Shield Layer]

Light shield layer 18 absorbs both the excessive light irradiated toward mirror device 1 and the extraneous light reflected by mirror device 1, thereby reducing the temperature rise inside the package.

The configuration in FIG. 2A is equipped with light shield layer 18 on the bottom surface of cover glass 5 so that light shield layer 18 absorbs a portion of light, transmitted through the inside of cover glass 5 and the extraneous light reflected by mirror device 1.

Light shield layer 18 can be formed as a layer of black material containing, for example, carbon.

[Cooling/Heat Dissipation Element]

Cooling/heat dissipation element 6 is joined onto the bottom surface of package substrate 3 and radiates the heat conducted from package substrate 3.

Cooling/heat dissipation element 6 comprises a heat dissipation plate or a metallic heat dissipation element. Furthermore, Cooling/heat-dissipation element 6 may be thermally connected to the inside of the package and other constituent components by way of a metallic Via by piercing, or embedding the metallic Via into package substrate 3.

In the configuration shown in FIG. 2A, a metallic heat dissipation element is directly mounted onto the bottom surface of package substrate 3.

[Coolant]

Coolant 7 cools cooling/heat dissipation element 6 by retaining the heat conducted from package substrate 3 and the like.

Coolant 7 is normally water, yet the use of a liquid with a higher transition heat enables more effective cooling. Coolant 7 should be an antirust and/or anti-corrosive water solution. Furthermore, coolant 7 may also be gelatinous. Coolant 7 may also be a gas. If it is a gas, it should have a high evaporation temperature.

[Coolant Cover]

Coolant cover 8 is joined to cooling/heat dissipation element 6, package substrate 3, and the like, and seals the above described coolant 7 to prevent leaking.

In the configuration shown in FIG. 2A, coolant cover 8 is joined to cooling/heat dissipation element 6 so that coolant 7 flows in the space formed between coolant cover 8 and cooling/heat dissipation element 6.

[Space Inside of Package]

The space inside of the package may be filled with a gaseous body or kept as an approximate vacuum. If it is filled with a gas with high thermal conductivity, the heat dissipation efficiency is improved.

The thermal conduction is improved by filling the space with an inert gas, such as a nitrogen gas, and the heat dissipation is thereby improved. Note that the thermal conductivity of a nitrogen gas is $2.4*10^{-2}$ Wm/K; that of helium is $14.2*10^{-2}$ Wm/K; and that of xenon is $0.52*10^{-2}$ Wm/K.

The above descriptions are the constituent components of the liquid-cooled package according to embodiment 1.

In FIG. 2A, the heat conducted from inside the package to cooling/heat dissipation element 6 by way of package substrate 3 is removed by coolant 7 circulating within coolant cover 8. Heat usually moves from a high temperature region to a low temperature region. Therefore, perpetually maintaining coolant 7 at a low temperature causes the heat inside of the package to move swiftly to the coolant 7, making it possible to improve the heat dissipation efficiency inside of the package.

FIG. 2B is a plain view diagram of the package assembly 100 shown in FIG. 2A, with cover glass 5 and intermediate element 4 removed.

Mirror array 11 is located on device substrate 10, which is connected, by way of wire 14, to circuit wiring pattern 13 on package substrate 3.

Thermal conduction element 2 (not shown in this drawing) is placed under device substrate 10 so that the heat is conducted from thermal conduction element 2 to package substrate 3, et cetera, to be radiated to the outside of the package.

FIG. 2C is a plain view diagram of the package assembly 100 shown in FIG. 2A.

The configuration of cover glass 5 and intermediate element 4 on the package assembly 100 as shown in FIG. 2B makes it possible to absorb, with light shield layer 18 applied to the bottom surface of cover glass 5, the light irradiated in the region other than mirror array 11 and the extraneous light reflected by mirror device 1. Circuit wiring pattern 13 extends from inside of the package to the outside, and to other parts, and radiates heat from inside the package.

The following is a description of a cooling system using coolant 7.

Thermal conduction is fastest in a solid, less so in a liquid, and slowest in a gas. Therefore, cooling is effected the fastest when heat is conducted to a metal at a very low temperature. Accordingly, heat dissipation efficiency is improved by cooling/heat dissipation element 6, which is made of, a metal, with coolant 7.

Cooling systems include a coolant circulation cooling system using a pump, an evaporation-compression cooling system using a coolant such as isobutene, an evaporation-adsorption cooling system adsorbing a coolant, and a Peltier effect cooling system utilizing a Peltier element.

The following describes a coolant circulation cooling system using a pump.

Figure 3A:
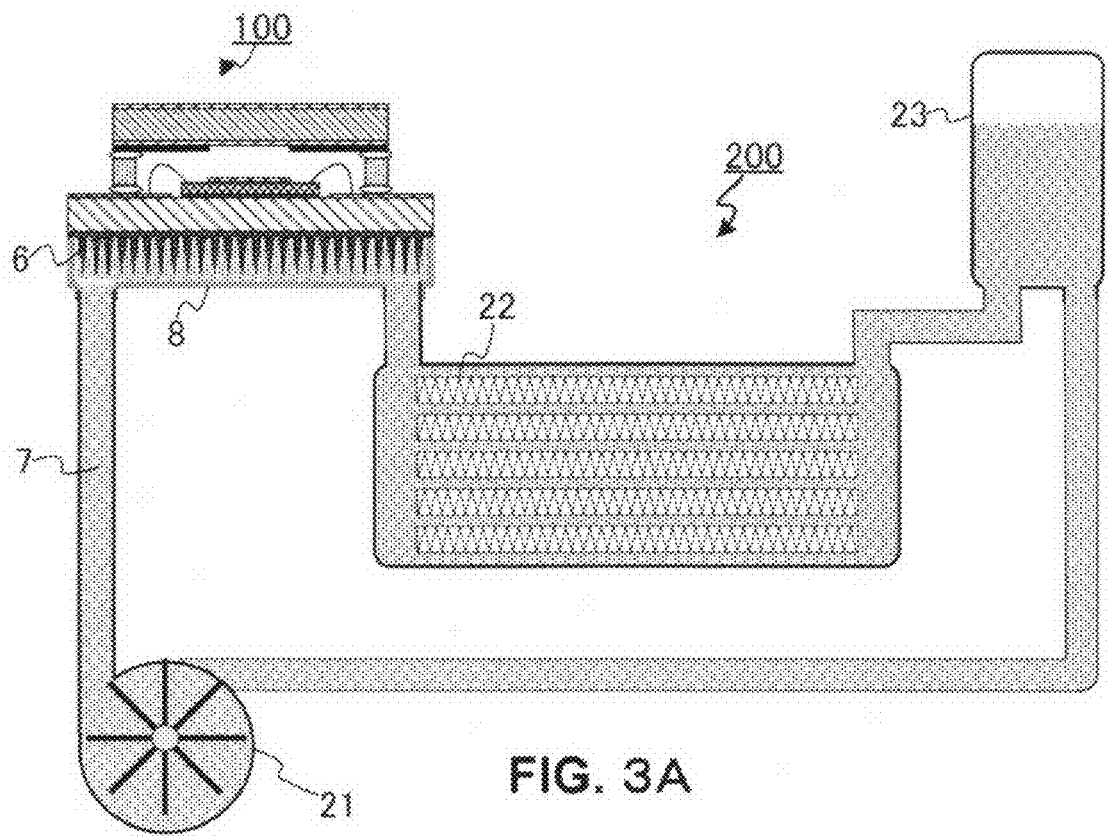
FIG. 3A is a diagram showing a coolant circulation cooling system using a pump for cooling a mirror device.

FIG. 3A shows a coolant circulation cooling system using a pump.

Referring to FIG. 3A, coolant circulation cooling system 200 using a pump is configured to cool cooling/heat dissipation element 6 of package assembly 100 with coolant 7. In order to circulate coolant 7, a part of coolant cover 8 is equipped with the inlet (IN) and outlet (OUT) of the coolant flow path that circulates coolant 7.

The coolant flow path of coolant cover 8 on the IN side is equipped with water pump 21 if coolant 7 is a liquid, or with a fan if coolant 7 is a gas. The electrically driven water pump 21 or a fan circulates coolant 7. The electric power is supplied from an external power source.

Meanwhile, radiator 22 is placed on the coolant flow path of coolant cover 8 on the OUT side. Coolant 7, heated by cooling/heat dissipation element 6, is cooled in radiator 22. A fan may additionally be used for cooling radiator 22.

Reservoir tank 23 is placed in the flow path of coolant 7. Reservoir tank 23 functions as buffer against an increase in coolant volume due to a rise in the fluid level of coolant 7 caused by a variation in atmospheric pressure and by the vaporization of coolant 7 caused by a thermal expansion.

The configuration as described above makes it possible to circulate coolant 7. The heat is thus conducted from inside of the package to cooling/heat dissipation element 6 and transferred to coolant 7. Therefore, the heat dissipation efficiency is improved by the circulation of coolant 7. Since heat naturally moves from a high temperature region to a low temperature region, it is possible to improve thermal transfer efficiency by maintaining coolant 7 as the low temperature region by cooling it relative to cooling/heat dissipation element 6.

Figure 3B:
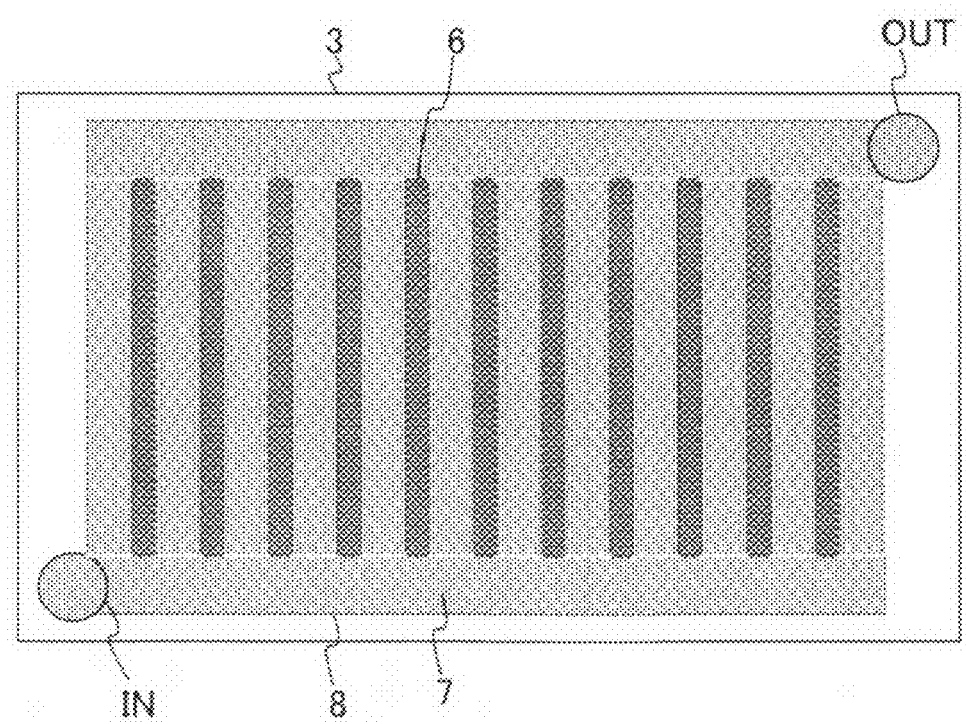
FIG. 3B is a bottom view diagram of the assembled body (shown in FIGS. 2A through 2C) adopting the coolant circulation cooling system with the use of a pump.

FIG. 3B is a bottom view diagram of the package assembly (shown in FIGS. 2A through 2C) with a coolant circulation cooling system using the pump shown in FIG. 3A.

FIG. 3B shows the configuration of the inlet (IN) and outlet (OUT) of the coolant flow path that circulates coolant 7 placed at the, lower left and upper right hand side of the coolant cover 8, respectively. The inside of coolant cover 8 is filled with coolant 7 so as to cool cooling/heat dissipation element 6 formed on the bottom surface of package substrate 3.

Note that coolant circulation cooling equipment 200, and package assembly 100, can also be construed as a mirror device in a broad sense comprising a mirror device in a narrow sense.

Embodiment 2

The following is a description of the configuration of a liquid-cooled package according to preferred embodiment 2. The liquid-cooled package according to embodiment 2 illustrates the modification of the liquid-cooled package according to embodiment 1.

Differing from the liquid-cooled package according to embodiment 1, the liquid-cooled package according to embodiment 2 equips package substrate 3 with an opening that is smaller than device substrate 10. Device substrate 10 is placed so as to close the opening and so that coolant 7 contacts with the bottom surface of device substrate 10. Note that device substrate 10 and package substrate 3 are joined together with a seal element that is described for embodiment 1. Hence, the inside of the package is sealed off from coolant 7.

Such a configuration allows coolant 7 to contact the bottom surface of device substrate 10, thereby enabling the removal of heat without going through package substrate 3. Therefore the heat dissipation efficiency of the inside of the package is improved.

The other constituent parts of embodiment 2 are similar to those of embodiment 1 and therefore descriptions are not provided here. Note that an alternative configuration may be such that cooling/heat dissipation element 6 or thermal conduction element 2 is placed on the bottom surface of device substrate 10.

Figure 4A:
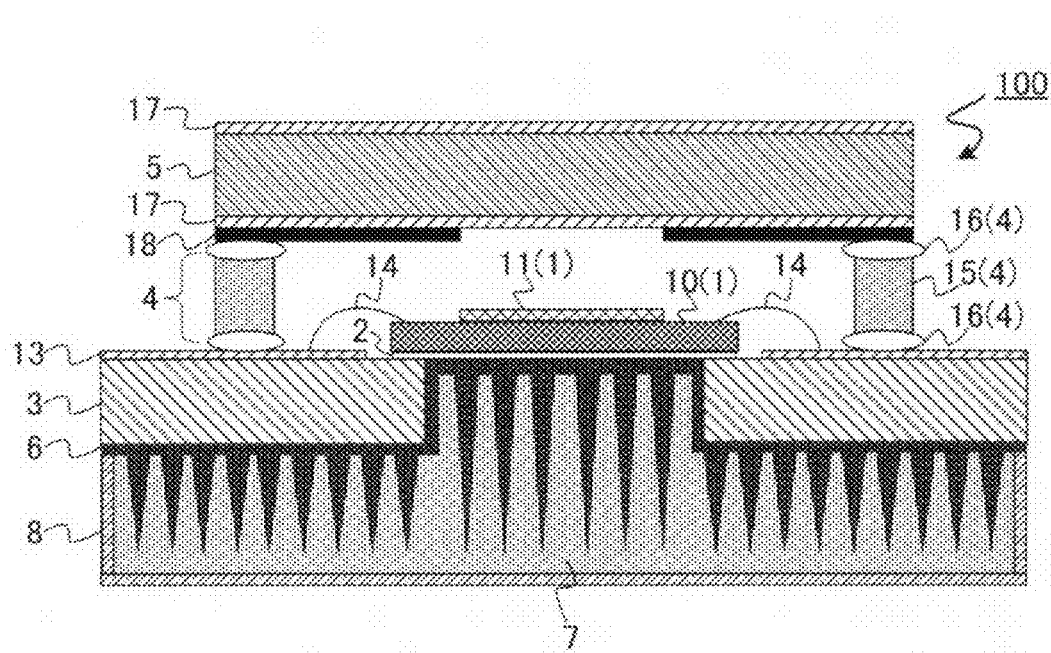
FIG. 4A is a front cross-sectional diagram of an assembled body comprising a mirror device with a liquid-cooled package according to preferred embodiment.

FIG. 4A is a front cross-sectional diagram of a package assembly in which a mirror device is implemented with a liquid-cooled package according to embodiment 2.

FIG. 4A shows the opening of package substrate 3, closed by device substrate 10, which is larger than the opening. Furthermore, cooling/heat dissipation element 6 is placed on the bottom surface of device substrate 10 so that coolant 7 comes into contact directly with the bottom surface of device substrate 10. Thus, the heat conducted from the inside of the package to cooling/heat dissipation element 6 by way of package substrate 3 and device substrate 10 is removed by coolant 7 circulating within coolant cover 8. Since heat naturally moves from a high temperature region to a low temperature region, perpetually maintaining coolant 7 as the low temperature region by cooling it moves heat from inside of the package to coolant 7. Therefore, this configuration improves the efficiency of heat dissipation from inside the package.

Figure 4B:
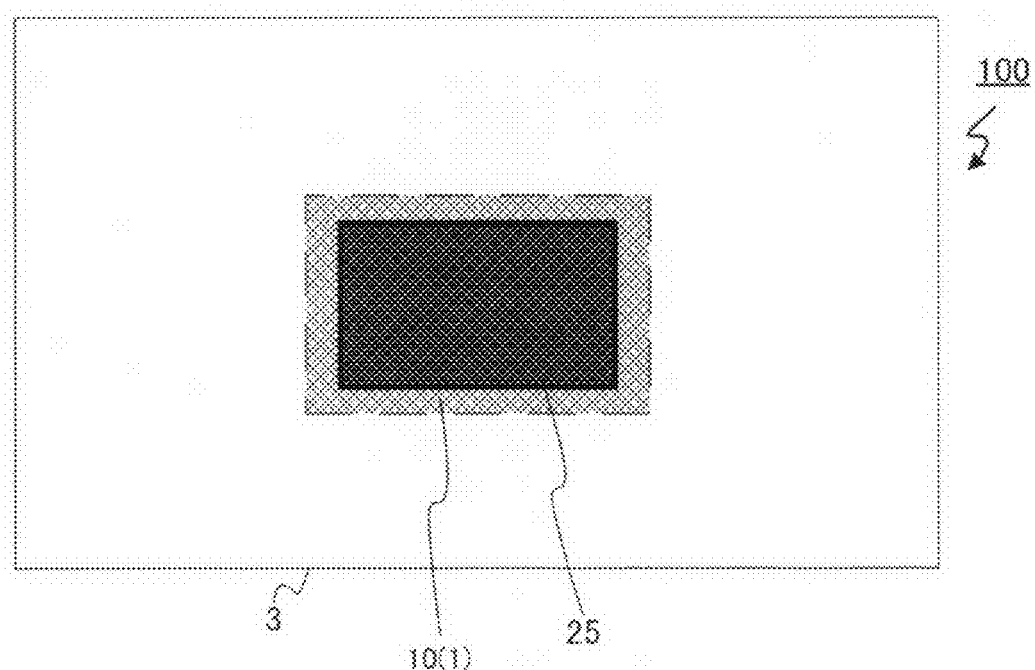
FIG. 4B is a bottom view diagram of the assembled body shown in FIG. 4A.

FIG. 4B is a bottom view diagram of the package assembly shown in FIG. 4A. Note that, in order to show opening 25 of package substrate 3, cooling/heat dissipation element 6 and coolant cover 8 are not shown here and the device substrate 10 is shown in dotted lines.

As shown in FIG. 4B, opening 25 is placed at the center of package substrate 3 and is closed with device substrate 10. Package substrate 3 and device substrate 10 are joined with a seal element as described above.

Embodiment 3

The following is a description of the configuration of a liquid-cooled package according to preferred embodiment 3. The liquid-cooled package according to embodiment 3 is a modification of the liquid-cooled package according to the embodiment 1.

Differing from the liquid-cooled package according to embodiment 1, the liquid-cooled package according to embodiment 3 places a coolant flow path within cooling/heat dissipation element 6, thus requiring no coolant cover 8. It also equips cooling/heat dissipation element 6 with the inlet (IN) and outlet (OUT) of the coolant flow path, which circulates coolant 7.

The other constituent parts of embodiment 3 are similar to those of the embodiment 1 and therefore further descriptions are not provided here.

Figure 5:
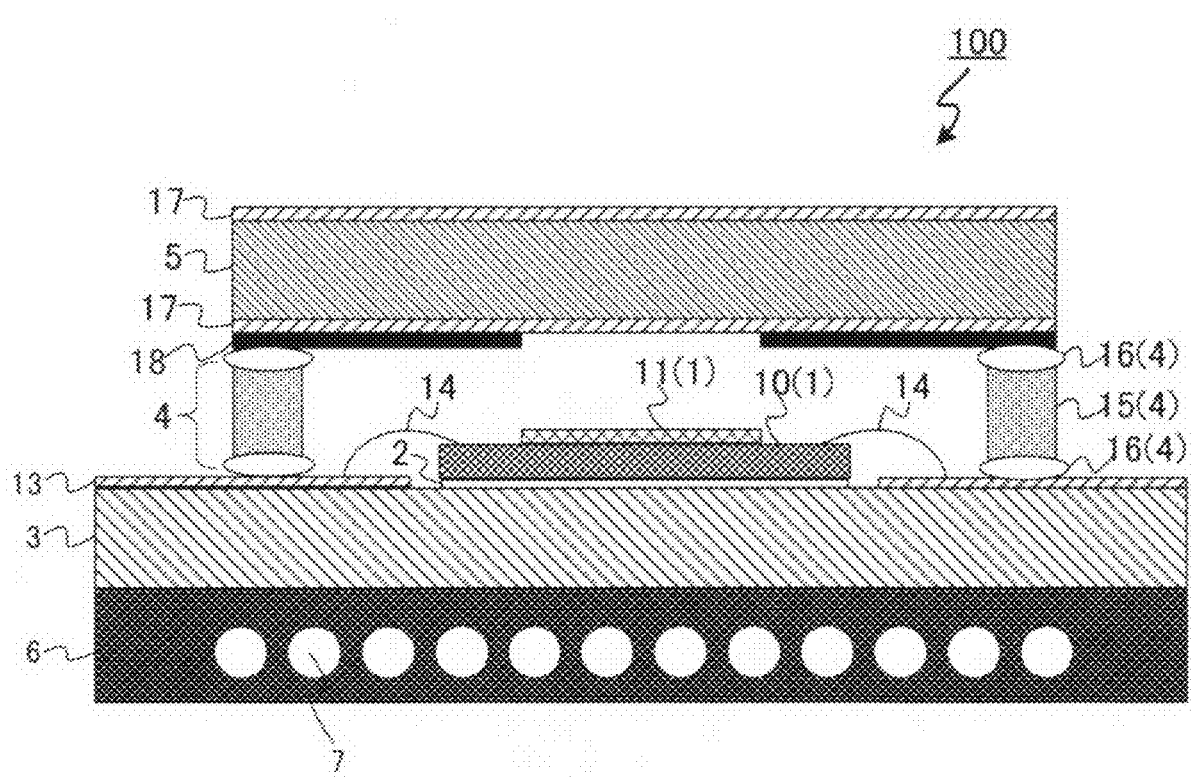
FIG. 5 is a front cross-sectional diagram of an assembled body comprising a mirror device with a liquid-cooled package according to preferred embodiment 3.

FIG. 5 is a front cross-sectional diagram of an package assembly in which a mirror device is implemented with a liquid-cooled package according to embodiment 3.

In FIG. 5, the heat conducted from inside of the package to cooling/heat dissipation element 6 by way of the package substrate 3 is removed by coolant 7 circulating within cooling/heat dissipation element 6. Since heat naturally moves from a high temperature region to a low temperature region, perpetually maintaining the coolant 7 as a low temperature region by cooling it moves the heat from inside the package swiftly to coolant 7. Therefore, this configuration improves the efficiency of heat dissipation from inside the package.

Embodiment 4

The following is a description of the configuration of a liquid-cooled package according to preferred embodiment 4. The liquid-cooled package according to embodiment 4 is a modification of the liquid-cooled package according to embodiment 3.

Differing from the liquid-cooled package according to embodiment 3, the liquid-cooled package according to embodiment 4 provides package substrate 3 with an opening. It also places cooling/heat dissipation element 6, which internally comprises a coolant flow path, that closes the opening. This configuration places cooling/heat dissipation element 6 on the bottom surface of device substrate 10. Device substrate 10 and cooling/heat dissipation element 6 are joined together by a seal element as described for embodiment 1. Note that a coolant flow path is equipped within cooling/heat dissipation element 6 as described for embodiment 3, and therefore coolant cover 8 is no longer required.

The other constituent parts of embodiment 4 are similar to those of embodiment 3 and therefore further descriptions are not provided here.

Figure 6:
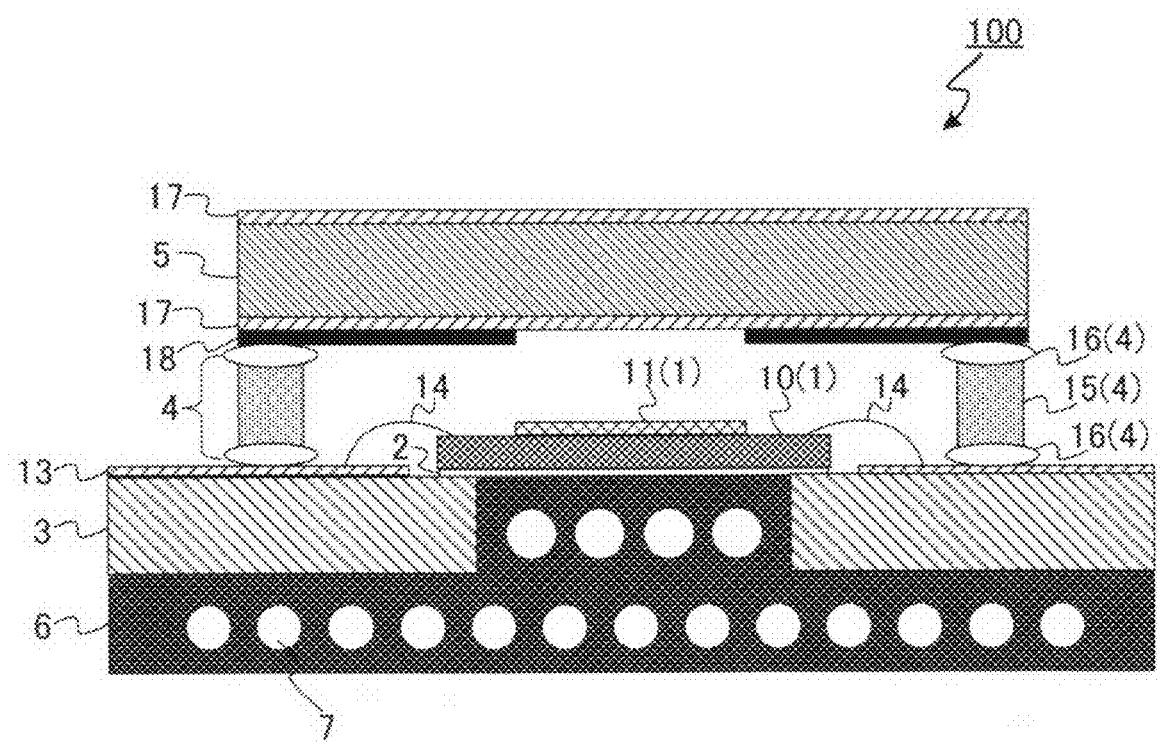
FIG. 6 is a front cross-sectional diagram of an assembled body comprising a mirror device with a liquid-cooled package according to preferred embodiment 4.

FIG. 6 is a front cross-sectional diagram of an package assembly in which a mirror device is implemented with a liquid-cooled package according to embodiment 4.

In FIG. 6, the heat conducted from inside of the package to cooling/heat dissipation element 6 by way of the bottom and side surface of package substrate 3 and by way of the bottom surface of device substrate 10 is removed by coolant 7 circulating inside cooling/heat dissipation element 6. Since heat naturally moves from a high temperature region to a low temperature region, perpetually maintaining the coolant 7 as the low temperature region by cooling it moves the heat inside of the package swiftly to coolant 7. This configuration thus improves the efficiency of heat dissipation from inside the package.

Embodiment 5

The following is a description of the configuration of a liquid-cooled package according to preferred embodiment 5. The liquid-cooled package according to embodiment 5 is a modification of the liquid-cooled package according to embodiment 4.

Differing from the liquid-cooled package according to embodiment 4, the liquid-cooled package according to embodiment 5 eliminates cooling/heat dissipation element 6 placed on the bottom surface of package substrate 3. It also aligns the height of package substrate 3 to that of cooling/heat dissipation element 6 which is joined to both a side surface of the package substrate 3 and the bottom surface of device substrate 10 in which a coolant flow path is enclosed.

The other constituent parts of embodiment 5 are similar to those of embodiment 4 and therefore further descriptions are not provided here.

Such a configuration improves the efficiency of heat dissipation from inside of the package while maintaining the same size common to that of an package assembly accommodating a mirror device.

Figure 7:
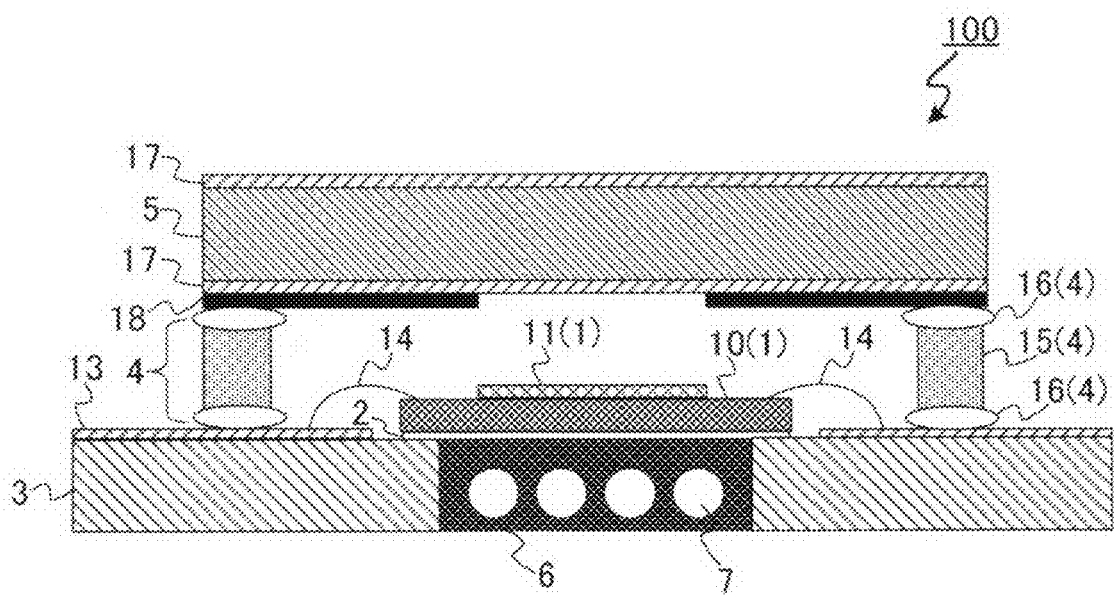
FIG. 7 is a front cross-sectional diagram of an assembled body comprising a mirror device with a liquid-cooled package according to preferred embodiment 5.

FIG. 7 is a front cross-sectional diagram of an package assembly in which a mirror device is implemented with a liquid-cooled package according to preferred embodiment 5.

In FIG. 7, the heat conducted from inside of the package to cooling/heat dissipation element 6 by way of the side surface of package substrate 3 and by way of the bottom surface of device substrate 10 is removed by coolant 7 circulating inside of cooling/heat dissipation element 6. Since heat naturally moves from a high temperature region to a low temperature region, perpetually maintaining coolant 7 as the low temperature region, by cooling it moves the heat inside of the package swiftly to coolant 7. Such a configuration improves the efficiency of heat dissipation from inside of the package. Note that a coolant flow path may be placed inside of package substrate 3. Furthermore, instead of placing a coolant flow path inside of cooling/heat dissipation element 6, a coolant flow path may alternately be placed only inside of package substrate 3.

Embodiment 6

The following is a description of a liquid-cooled package according to preferred embodiment 6. The liquid-cooled package according to embodiment 6 is a modification of the liquid-cooled package according to embodiment 1.

Differing from the liquid-cooled package according to embodiment 1, the liquid-cooled package according to embodiment 6 eliminate cooling/heat dissipation element 6 and places a coolant flow path inside of package substrate 3, thus requiring no coolant cover 8. It also equips package substrate 3 with the inlet (IN) and outlet (OUT) of the coolant flow path that circulates coolant 7.

The other constituent parts of embodiment 6 are similar to those of the embodiment 1 and therefore further descriptions are not provided here.

Figure 8:
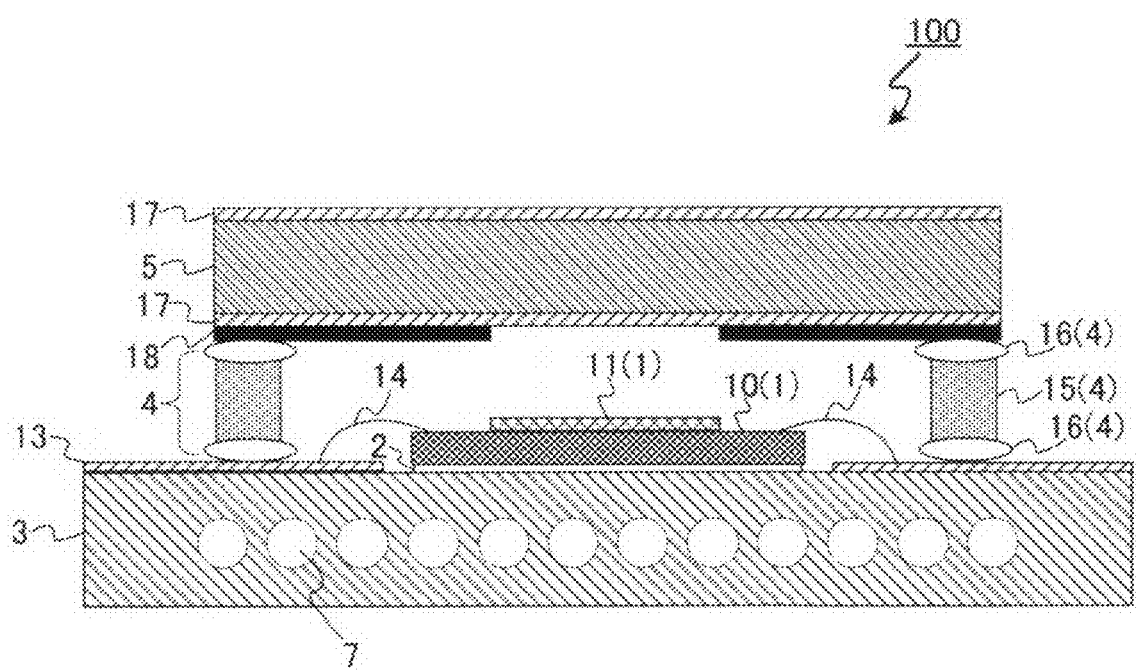
FIG. 8 is a front cross-sectional diagram of an assembled body comprising a mirror device with a liquid-cooled package according to preferred embodiment 6.

FIG. 8 is a front cross-sectional diagram of a package assembly in which a mirror device is implemented with a liquid-cooled package according to embodiment 6.

In FIG. 8, the heat conducted from inside of the package-to-package substrate 3 is removed by coolant 7 circulating inside of package substrate 3. Since heat naturally moves from a high temperature region to a low temperature region, perpetually maintaining coolant 7 as the low temperature region by cooling it moves the heat inside of the package swiftly to coolant 7. Such a configuration improves the efficiency of heat dissipation from inside of the package.

Embodiment 7

The following is a description of a liquid-cooled package according to preferred embodiment 7. The liquid-cooled package according to embodiment 7 is a modification of the liquid-cooled package according to embodiment 1.

Differing from the liquid-cooled package according to embodiment 1, the liquid-cooled package according to embodiment 7 transports coolant 7 using an electric kinetic (EK) pump. It also eliminates cooling/heat dissipation element 6 and equips the inside of package substrate 3 with a coolant flow path, thus requiring no coolant cover 8. Here, package substrate 3 is a substrate possessing electro-osmosis and is equipped, on either side, with electrodes retaining different charges. Coolant 7 uses a solution containing an electrolyte. This configuration also equips package substrate 3 with the inlet (IN) and outlet (OUT) of the coolant flow path, which circulates coolant 7.

The other constituent parts of embodiment 7 are similar to those of embodiment 1 and therefore further descriptions are not provided here.

The following describes the function of an electric kinetic (EK) pump for transporting the coolant. A tubular structure is formed by an electro-osmotic material, e.g., a dielectric substance such as silica, possessing an electro-osmosis that generates an electric potential when in contact with a liquid. When a solution containing an electrolyte is poured into the tubular structure, the solution is ionized. The electrons of the ionized solution are transferred to the electro-osmotic material which is then negatively charged. The positively charged particles in the electrolytic solution are gathered on the surface of the electro-osmotic element to form an electric double layer. Positively charged particles in the electrolytic solution also exist in places apart from the surface of the electro-osmotic element, so that when an electric field is applied in parallel to the flow path of the electrolytic solution in the tubular structure that is formed by the electro-osmotic material, the charged particles in the electrolytic solution move so as to move non-charged particles, with its viscosity, in the same direction. A pump utilizing this action is called an electro osmotic (EO) pump, or an electro kinetic (EK) pump in a broad sense.

Embodiment 7 uses electrodes for externally applying an electric field.

Figure 9A:
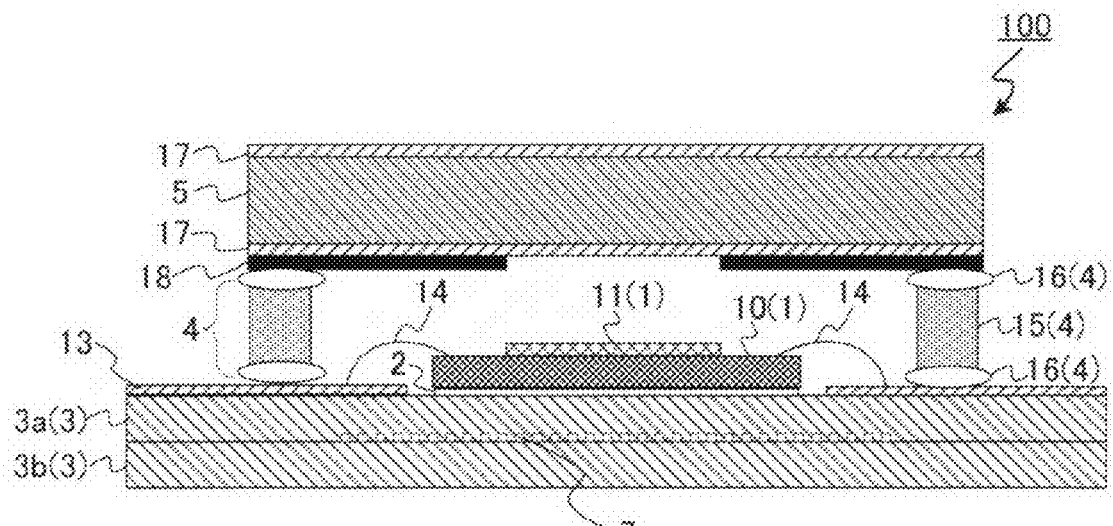
FIG. 9A is a front cross-sectional diagram of an assembled body comprising a mirror device with a liquid-cooled package according to preferred embodiment 7.

FIG. 9A is a front cross-sectional diagram of an package assembly in which a mirror device is implemented with a liquid-cooled package according to preferred embodiment 7.

Embodiment 7 uses glass electro-osmosis as a package substrate 3. It also forms package substrate 3 by joining together an upper package substrate 3a, which comprises multiple coolant flow paths, and lower package substrate 3b. The diameter of the coolant flow path should be about 1 μm.

The coolant flow path can be made by etching grooves in the, upper package substrate 3a, which is joined together with a flat lower package substrate 3b in the present embodiment. Other methods for creating such a coolant flow path are also possible.

The configuration shown in FIG. 9A places, on the nearside and far side, electrodes (not shown in this drawing) retaining different charges.

Figure 9B:
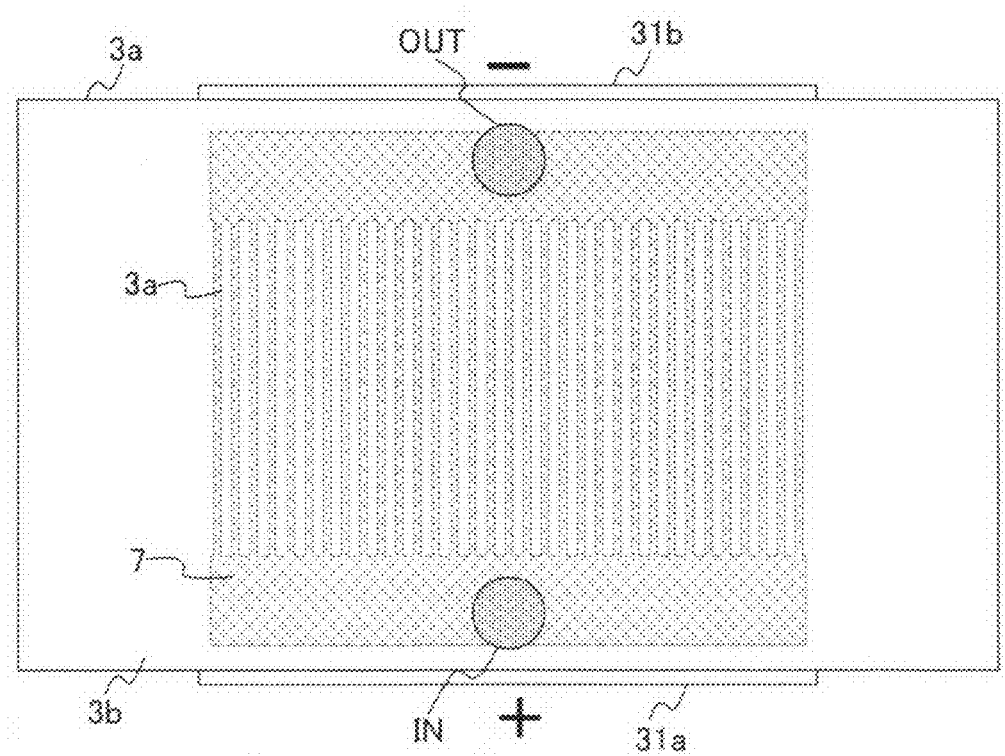
FIG. 9B is a bottom view diagram of the assembled body comprising a mirror device with a liquid-cooled package according to embodiment 7.

FIG. 9B is a bottom view diagram of the package assembly in which a mirror device is implemented with a liquid-cooled package according to embodiment 7.

FIG. 9B equips lower package substrate 3b with the inlet (IN) and outlet (OUT) that are circulation holes of coolant 7. Further, a + (positive) electrode 31a is placed on a side surface of the package substrate on the IN side, and a − (negative) electrode 31b is placed on a side surface of the package substrate on the OUT side. It is thus possible to generate an electric field parallel to the coolant flow path with both electrodes 31a and 31b, which retain different charges.

Figure 9C:
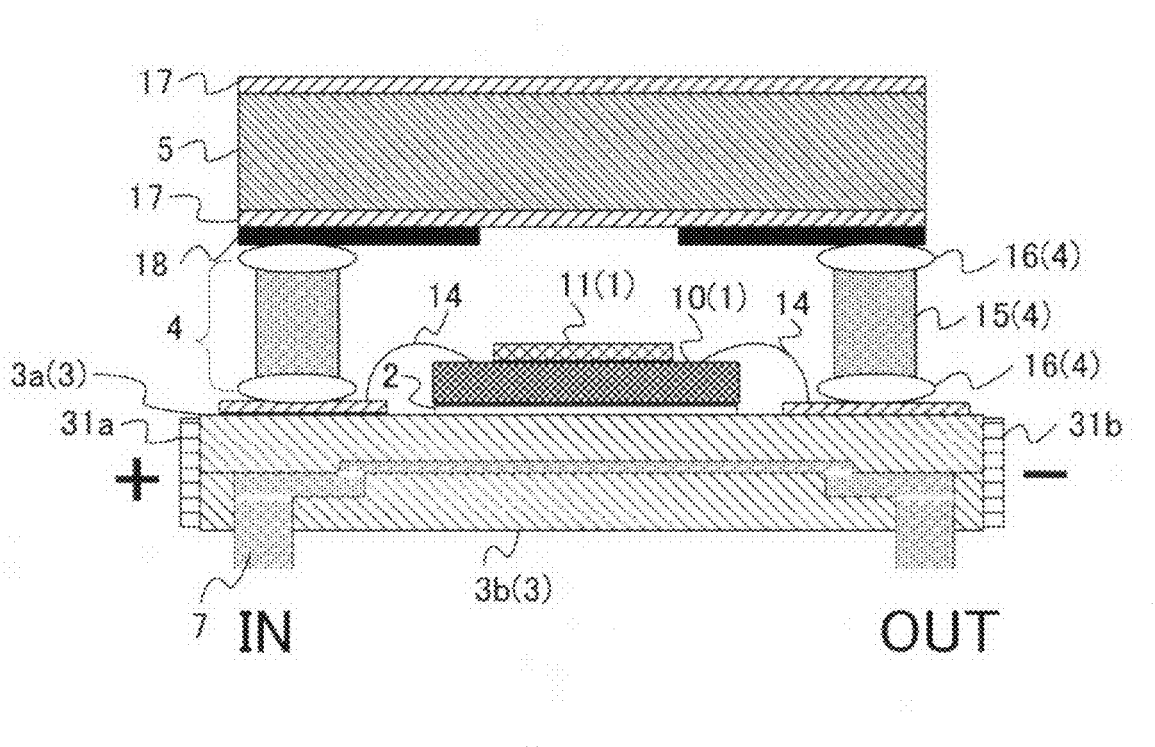
FIG. 9C is a side view diagram of the assembled body comprising a mirror device with a liquid-cooled package according to embodiment 7.

FIG. 9C is a side view diagram of the package assembly in which a mirror device is implemented with a liquid-cooled package according to embodiment 7.

A + (positive) electrode 31a is placed on a side of the package substrate on the IN side that is the inlet of coolant 7, and a − (negative) electrode 31b is placed on a side of the package substrate on the OUT side that is the outlet of coolant 7, which has absorbed the heat from the inside of the package.

A configuration such as shown in FIGS. 9A through 9C causes coolant 7 circulating inside of package substrate 3 to remove the heat conducted from inside the package to package substrate 3. Since heat naturally moves from a high temperature region to a low temperature region, perpetually maintaining coolant 7 as the low temperature region by cooling it moves the heat inside of the package swiftly to coolant 7. This configuration therefore improves the efficiency of heat dissipation from inside of the package.

While embodiment 7 uses a glass substrate for package substrate 3 with the coolant flow path, an alternative configuration may use a dielectric substrate such as porous glass.

Additionally, coolant 7 may contain a liquid containing low conductivity electrolytes and a solvent with a relatively large permittivity, such as an organic solvent, e.g. alcohols and acetonitrile.

Note that while embodiment 7 uses the EK pump by making package substrate 3 an electro-osmotic element, it is also possible to use an EK pump by placing, on the bottom surface of package substrate 3, an electro-osmotic element having a coolant flow path as described in embodiment 3. It is also possible to use an EK pump by placing an electro-osmotic element having a coolant flow path that is joined to a side surface of package substrate 3 and to the bottom surface of device substrate 10 as described in embodiment 5.

As described above, a configuration using an EK pump eliminates the need to equip the outside of a liquid-cooled package with a water pump or the like, thereby making it possible to decrease the size of the device. Additionally, since the EK pump has no moving parts, it creates little noise and has a long functional life.

The liquid-cooled package as described in embodiments 1 through 7 can easily be applied to a mirror device that is decreased in size.

[Projection Apparatus]

A mirror device implemented with the liquid-cooled package as described above can be used for a projection apparatus.

The projection apparatus may be a single-panel projection apparatus comprising one mirror device implemented with the liquid-cooled package or a multi-panel projection apparatus comprising multiple mirror devices implemented with the liquid-cooled package.

Figure 10:
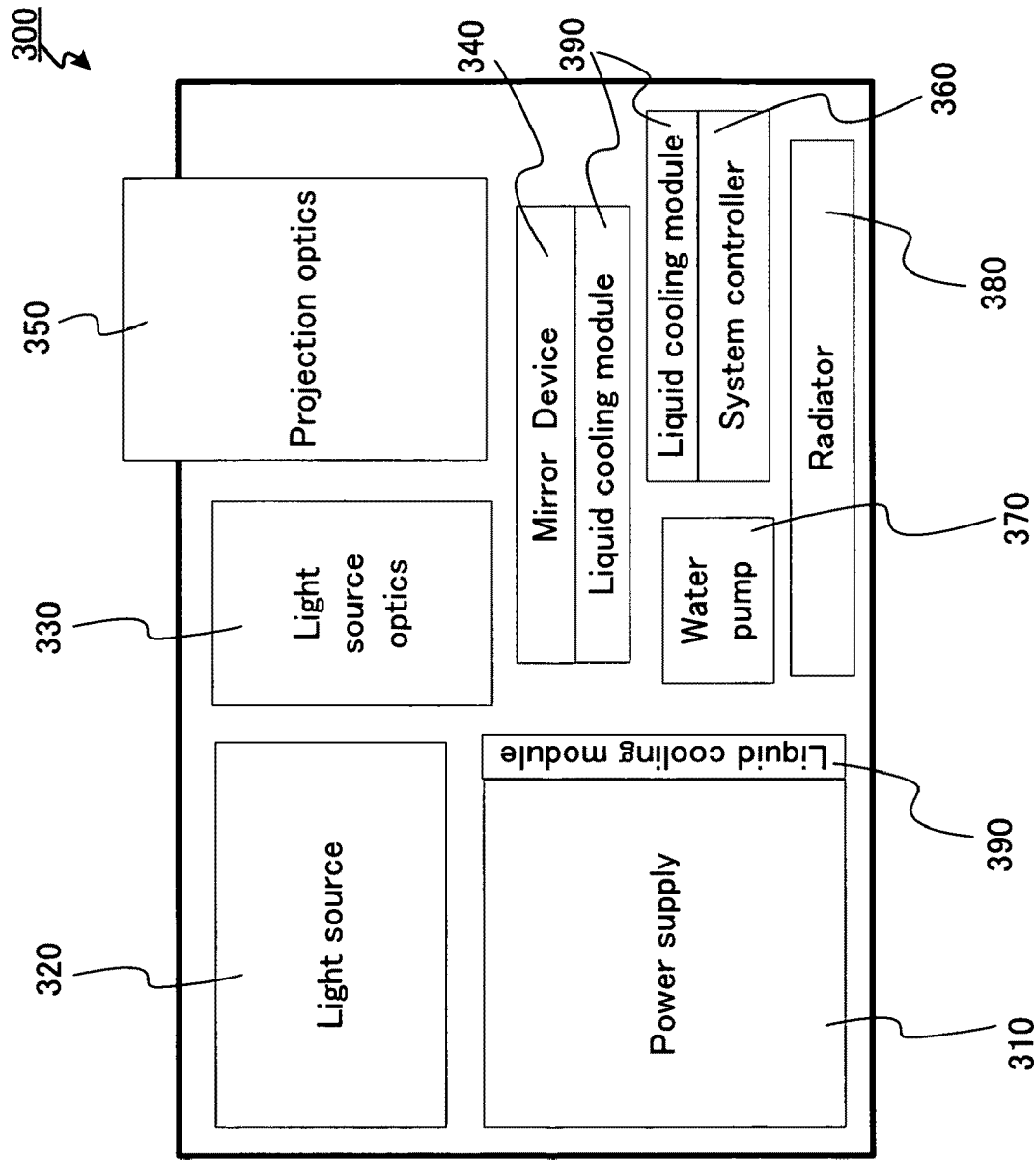
FIG. 10 is an outline diagram of a projection apparatus comprising a mirror device with a liquid-cooled package.

FIG. 10 is an outline diagram of a projection apparatus comprising a mirror device implemented with a liquid-cooled package according to the present embodiment.

The projection apparatus 300 shown in FIG. 10 comprises a power supply 310, a light source 320, a light source optical system 330, and a mirror device 340 accommodated by a liquid-cooled package, a projection optical system 350, and a system controller 360. It further comprises a water pump 370, a radiator 380, and a cooling module 390, which are used for liquid cooling.

Power supply 310 supplies power to the individual constituent units or the projection apparatus.

Light source 320 is driven by the power supplied from power supply 310 and emits light. While light source 320 may use any kind of light source, such as a mercury lamp, a laser light source is preferable.

Light source optical system 330 appropriately adjusts the light emitted from light source 320 and guides it to mirror device 340.

Mirror device 340 modulates the light guided from light source optical system 330 and controls the projection of an image on a screen by controlling the direction reflected light.

Projection optical system 350 projects an image on the screen by appropriately adjusting the light modulated and reflected by mirror device 340.

System controller 360 controls mirror device 340 and light source 320. For example, system controller 360 sends an image signal to mirror device 340, controls the light source 320 and mirror device 340 simultaneously, and controls light source 320 so as to create a pulse emission. System controller 360 comprises, for example, a central processing unit (CPU).

The following is a description of how each constituent unit of projection apparatus 300 is cooled with a liquid, with reference to FIG. 10. The principle of liquid cooling for improving the efficiency of heat dissipation from inside of the package is the same as described above.

In FIG. 10, each constituent unit of the projection apparatus is cooled by means of a coolant circulation cooling system that circulates the coolant with a water pump as described for FIG. 3A.

Water pump 370 and radiator 380 operate as described for FIG. 3A. Note that radiator 380 may be equipped with a cooling fan to cool it.

The coolant is circulated within cooling module 390, which is placed so as to contact each constituent unit of the projection apparatus. The use of cooling module 390 cools each constituent unit. In FIG. 10, power supply 310 and system controller 360 are also cooled, in addition to mirror device 340, with the cooling module 390.

The cooling of the mirror device is cooled is not described here since the principle of cooling is described for FIGS. 3A and 3B.

Power supply 310 can possibly be shorted by a rise in temperature should there be cooled. FIG. 10 shows the circulation path of the coolant cooling mirror device 340, which passes cooling module 390 which also is in contact with the power supply 310 so that the power supply 310 is also cooled in addition to mirror device 340.

System controller 360 can also be shorted or fail in its circuit due to a rise in temperature. For example, system controller 360 is configured to include a CPU, or a related component, and the CPU can be damaged by a temperature rise. Therefore, system controller 360 should also be cooled. In FIG. 10, the circulation path of the coolant cooling mirror device 340 is placed so as to pass cooling module 390 which also in contact with system controller 360 so that system controller 360 is cooled in addition to mirror device 340 and power supply 310.

Additionally, the circulation path of the coolant cooling mirror device 340 is appropriately placed so that each constituent unit of the projection apparatus 300 can be cooled.

Furthermore, an individual circulation path using a coolant may be designed to cool each constituent unit.

The reservoir tank described for FIG. 3A and a cooling module may be integrated.

Furthermore, a thermostat or the like may be used to circulate the coolant on as required.

The following is a description of the correlation between the individual constituent units and the principle of projection in the projection apparatus 300 shown in FIG. 10.

Figure 11:
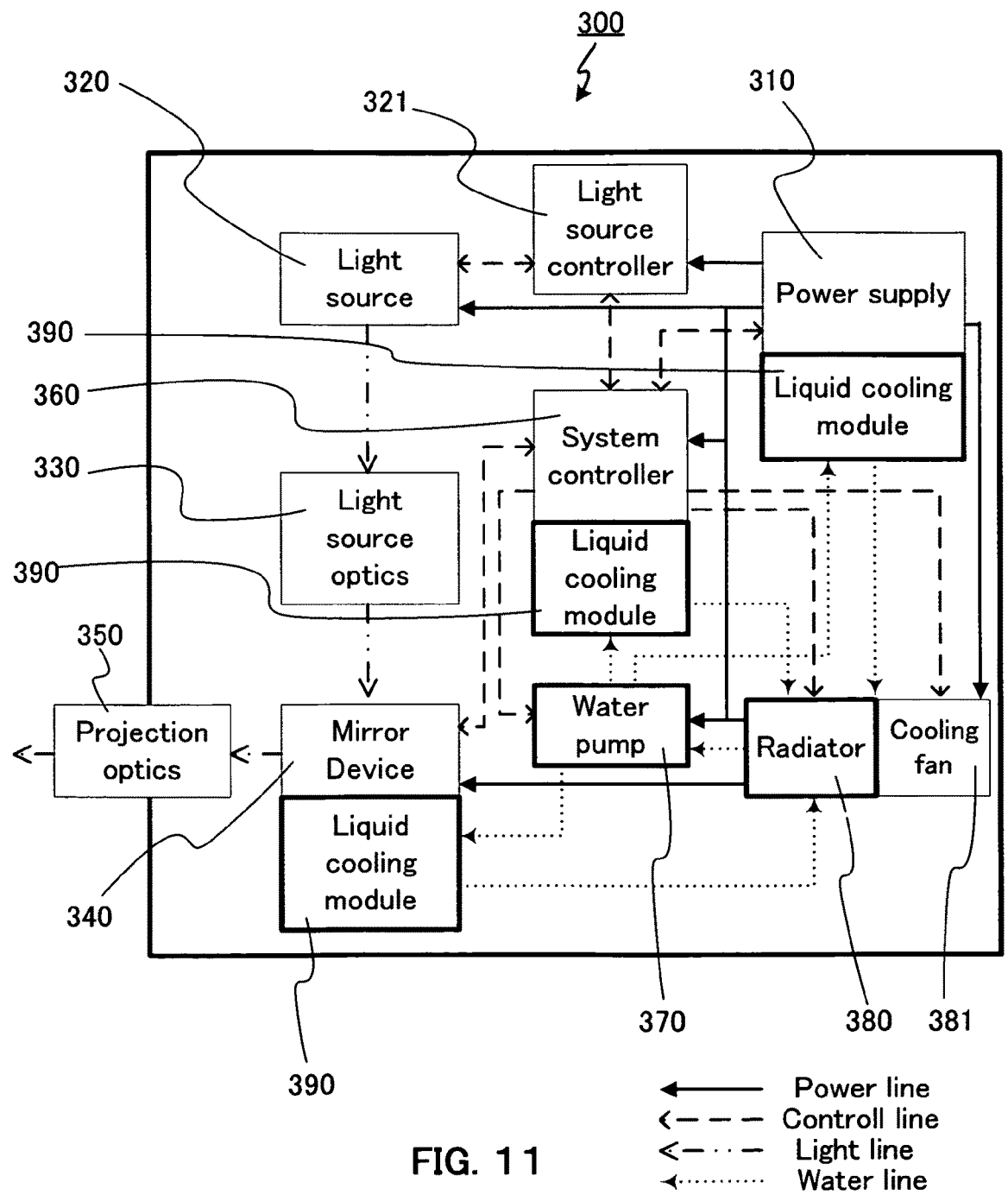
FIG. 11 is a correlation diagram of individual units comprising the projection apparatus shown in FIG. 10.

FIG. 11 is a correlation diagram of individual constituent units of a projection apparatus 300 shown in FIG. 10.

FIG. 11 shows the correlation between the power supply, control, light, and coolant (such as water) in the individual constituent units of the projection apparatus 300. Note that relationships with the power supply is shown by solid lines, with the control by broken lines, with the light by two-dot chain lines, and with the coolant (e.g., water) by dotted lines. Radiator 380 is equipped with a cooling fan 381. The solid line shows the flow of power from the power supply to each constituent unit of projection apparatus 300.

Power supply 310 in FIG. 11 supplies power for driving: a cooling fan 381 for cooling the radiator 380, a light source controller 321 controlling the blinking of the light source 320, a light source; a system controller 360 controlling the mirror device 340, a light source controller 321, a mirror device 340, and a water pump 370. The broken line shows the control of each constituent unit of projection apparatus 300.

In FIG. 11, the power supplied from power supply 310 operates the controller 360, which then performs the power adjustment of a power supply 310, a light source control of light source controller 321, a control of the mirror element of mirror device 340, a control of radiator 380, a control of cooling fan 381, and a control of water pump 370. Furthermore, light source controller 321 controls the blinking of the light source 320 on the basis of the control performed by system controller 360.

Mirror device 340, light source controller 321, and power supply 310 are capable of reporting information about their respective operations to system controller 360. Additionally, light source 320 is capable of reporting its operation information (about its operation) to light source controller 321. Furthermore, mirror device 340 and light source 320 are enabled for synchronous control by the controls of mirror device 340 and light source controller 321 by a control signal from system controller 360. The two-dot chain line shows the flow of light towards a projection onto a screen.

In FIG. 11, the light emitted from light source 320 is irradiated on light source optical system 330. The light then passes through light source optical system 330 is appropriately adjusted and irradiated on mirror device 340. The light irradiated on mirror device 340 is modulated by the mirror of mirror device 340 and the reflecting direction is determined. The light reflected by mirror device 340 is then transmitted through projection optical system 350. As a result, the light transmitted through projection optical system 350 is projected onto a screen. The dotted line shows the circulation of coolant.

In FIG. 11, multiple circulation paths for the coolant are provided, instead of one circulation path to cool the individual constituent units as described for FIG. 10. Furthermore, the circulation paths of the coolant merge in radiator 380. As such, the circulation paths of the coolant may be changed according to design. Additionally, different coolants may be used in different circulation paths.

In FIG. 11, water pump 370 circulates the coolant. Therefore, the starting point of the coolant circulation is placed at water pump 370, which sends the coolant to 1) cooling module 390, which is in contact with mirror device 340, 2) cooling module 390, which is in contact with system controller 360, and 3) cooling module 390, which in contact with power supply 310, so that the coolant cools mirror device 340, system controller 360, and power supply 310. Having cooled mirror device 340, system controller 360, and power supply 310, the coolant goes through its respective circulation paths and merges in radiator 380. Cooling fan 381 is placed on radiator 380 so that the coolant is cooled therein. Having been cooled in radiator 380, the coolant goes back to water pump 370 and is re-circulated. As such, a mirror device implemented with a liquid-cooled package can be used in a projection apparatus. The mirror device implemented with the liquid-cooled package has been described above. Also described is the liquid-cooled package compatible to a decrease in size of the mirror device. The present invention improves the efficiency of a mirror device. By cooling of the mirror device, and the power supply, the CPU, etc., of the system controller, and other constituent units of a projection apparatus, failure in the projection apparatus due to the heat is prevented.

Note that the embodiments of present invention as described above may be modified in various manners and would still be within the scopes and spirit of the present invention. For these reasons, even though the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A mirror device comprises a mirror array including a plurality of mirror elements for modulating an incident light emitted from a light source for controlling a reflecting direction of the incident light, wherein the mirror device further comprising:
    a coolant flow channel for containing and flowing a liquid coolant therethrough for cooling the mirror element;
    a device substrate for forming and supporting the mirror elements thereon; a package substrate for supporting and proper placement of the device substrate thereon;
    a heat dissipating device dissipating a heat conducting from the package substrate and the device substrate;
    the liquid coolant in said coolant flow channel dissipating the heat conducted to said heat-dissipating device; and
    the package substrate comprises a hole having an area smaller than the device substrate and the device substrate is disposed on a top surface of said package substrate covering said hole wherein the device substrate having a bottom surface exposed through said hole for contacting said heat dissipating device for dissipating heat therefrom.

2. The mirror device according to claim 1, wherein:
    the heat-dissipating device contacts the device substrate with said coolant channel formed in said device substrate.

3. The mirror device according to claim 1, wherein:
    said coolant channel formed in said package substrate.

4. The mirror device according to claim 1, further comprising:
    a coolant circulation unit hydraulically linked to said coolant flow channel for circulating the liquid coolant therein.

5. The mirror device according to claim 1, wherein:
    said heat-dissipating device dissipating heat conducted from the liquid coolant.

6. The mirror device according to claim 1, wherein:
    the liquid coolant flows through said coolant flow channel comprises an antirust and/or anticorrosion coolant.

7. The mirror device according to claim 5, further comprising:
    a cooling fan for cooling the heat-dissipating device.

8. A mirror device comprises a mirror array including a plurality of mirror elements for modulating an incident light emitted from a light source for controlling a reflecting direction of the incident light, wherein the mirror device, further comprising:
    a coolant flow channel for containing and flowing a liquid coolant therethrough for cooling the mirror element;
    a power supply and a system controller; and
    the liquid coolant flows through said coolant flow channel is configured for cooling at least either the power supply for the mirror device or the system controller for controlling the mirror device.

9. The mirror device according to claim 8, wherein:
the liquid coolant flows through said coolant flow channel comprises a water solution of an antirust and/or anticorrosion coolant.

10. A mirror device formed and supported on a device substrate comprising an array of mirror elements for modulating an incident light emitted from a light source for controlling the reflecting direction of the incident light, comprising:
- a package substrate for supporting and placement of the device substrate thereon wherein said package substrate further comprises a coolant flow channel for containing and flowing a liquid coolant therethrough;
- the package substrate comprises a hole having an area smaller than the device substrate,
- the device substrate is disposed on a top surface of said package substrate covering said hole wherein the device substrate having a bottom surface exposed through said hole for dissipating heat therethrough.

11. A mirror device comprises a device substrate for forming and supporting a plurality of
mirror elements thereon for modulating incident light emitted from a light source and for controlling the reflecting direction of the incident light, comprising:
- a package substrate for supporting and placement of the device substrate thereon;
- an electro-osmotic element joined to the package substrate wherein said package substrate further comprising a coolant flow channel for containing and flowing a liquid coolant containing an electrolyte therethrough; and
- electrodes disposed on both sides of the electro-osmotic element and wherein said electrodes retain charges of opposite electric polarities.

12. The mirror device according to claim 11, wherein:
the liquid coolant flows through said coolant flow channel comprises a water solution of an antirust and/or anticorrosion coolant.

* * * * *